(12) United States Patent
Nalewajek et al.

(10) Patent No.: US 6,355,113 B1
(45) Date of Patent: *Mar. 12, 2002

(54) MULTIPLE SOLVENT CLEANING SYSTEM

(75) Inventors: David Nalewajek, West Seneca; Rajat Subhra Basu, Williamsville; David Paul Wilson, East Amherst; Michael Van Der Puy, Cheektowaga; Ellen Louise Swan, Ransonville; Peter Brian Logsdon, North Tonawanda, all of NY (US); Gary J. Zyhowski, Carol Stream, IL (US); Hepburn Ingham, Buffalo, NY (US); Daniel Franklin Harnish, Orchard Park, NY (US); Joel Edward Rodgers, Convent Station, NJ (US)

(73) Assignee: 3M Innovative Properties Company, St. Paul, MN (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/186,932

(22) Filed: Nov. 6, 1998

Related U.S. Application Data

(63) Continuation of application No. 08/070,586, filed on Jun. 1, 1993, now abandoned, which is a continuation-in-part of application No. 07/801,199, filed on Dec. 2, 1991, now abandoned.

(51) Int. Cl.[7] .............................. B08B 3/08; B08B 3/10; B08B 7/04; C03C 23/00; C23G 5/02

(52) U.S. Cl. .......................... 134/26; 134/10; 134/25.1; 134/31

(58) Field of Search .......................... 134/26, 25.1, 42, 134/10, 2

(56) References Cited

U.S. PATENT DOCUMENTS

| | | | |
|---|---|---|---|
| 3,361,833 A | 1/1968 | Blodgett | 260/652.5 |
| 3,881,949 A | 5/1975 | Brock | |
| 3,886,668 A | 6/1975 | Remona et al. | 34/9 |
| 3,904,430 A | 9/1975 | Tipping et al. | |
| 3,957,531 A | 5/1976 | Tipping et al. | 134/11 |

(List continued on next page.)

FOREIGN PATENT DOCUMENTS

| | | |
|---|---|---|
| EP | 0 384 371 | 8/1980 |
| EP | 0 350 316 | 1/1990 |
| EP | 0 381 986 | 8/1990 |
| EP | 0 431 458 A1 | 6/1991 |
| EP | 0 490 501 | 6/1991 |

(List continued on next page.)

OTHER PUBLICATIONS

Patent Abstracts of Japan, vol. 17, No. 113 (C–1033) Mar. 9, 1993, including JP–A–04 297 590, Oct. 21, 1992.
Patent Abstracts of Japan, vol. 17, No. 67 (C–1025) Sep. 28, 1992 citing JP–A–04 272 194, Sep. 28, 1992.

(List continued on next page.)

*Primary Examiner*—Zeinab El-Arini
(74) *Attorney, Agent, or Firm*—Lisa M. Fagan

(57) ABSTRACT

A non-aqueous cleaning process uses an organic solvent for removing soil or surface contamination from contaminated articles such as printed circuit boards which are cleaned by immersion into a sump compartment of a cleaning tank containing the organic cleaning solvent. The organic solvent is preferably a hydrocarbon solvent. The cleaned articles, now coated with the organic cleaning solvent, are then disposed in a rinsing sump containing a fluorocarbon based rinsing solvent having an affinity for the organic cleaning solvent. The organic solvent is thus removed from the articles which are then dried without waste water as in a conventional solvent vapor degreasing solvent process.

8 Claims, 3 Drawing Sheets

U.S. PATENT DOCUMENTS

| | | | |
|---|---|---|---|
| 4,023,983 A | 5/1977 | Houke et al. | 134/2 |
| 4,060,439 A | 11/1977 | Rosemund et al. | 156/78 |
| 4,092,257 A | 5/1978 | Fozzard | 134/40 |
| 4,157,979 A | 6/1979 | Walters | 260/653 |
| 4,261,111 A | 4/1981 | Rand | 34/73 |
| 4,269,630 A | 5/1981 | Stephenson et al. | 134/26 |
| 4,332,841 A | 6/1982 | Price | |
| 4,482,465 A | 11/1984 | Gray | 62/122 |
| 4,640,719 A | 2/1987 | Hayes et al. | |
| 4,693,799 A | 9/1987 | Yanagihara et al. | 204/165 |
| 5,007,179 A | 4/1991 | Rodgers, Sr. et al. | 34/22 |
| 5,023,009 A | 6/1991 | Merchant | |
| 5,023,010 A | 6/1991 | Merchant | |
| 5,026,499 A | 6/1991 | Merchant | 134/12 |
| 5,035,830 A | 7/1991 | Merchant | 134/12 |
| 5,037,572 A | 8/1991 | Merchant | 134/12 |
| 5,039,445 A | 8/1991 | Merchant | 134/12 |
| 5,045,120 A | 9/1991 | Mittag et al. | 134/26 |
| 5,055,138 A | 10/1991 | Slinn | 134/11 |
| 5,059,728 A | 10/1991 | Lie et al. | 134/42 |
| 5,064,559 A | 11/1991 | Merchant et al. | 134/12 |
| 5,064,560 A | 11/1991 | Merchant | 134/12 |
| 5,073,288 A | 12/1991 | Anton | 134/12 |
| 5,073,290 A | 12/1991 | Anton et al. | 134/12 |
| 5,073,291 A | 12/1991 | Robeck et al. | 134/12 |
| 5,075,982 A | 12/1991 | Rodgers, Sr. et al. | |
| 5,076,956 A | 12/1991 | Anton | 134/12 |
| 5,080,831 A | 1/1992 | VanEenam | |
| 5,082,503 A | 1/1992 | Sluga et al. | 134/26 |
| 5,084,200 A | 1/1992 | Dishart et al. | 252/DIG. 1 |
| 5,096,501 A | 3/1992 | Dishart et al. | 134/10 |
| 5,099,081 A | 3/1992 | Bolmer et al. | 570/180 |
| 5,099,082 A | 3/1992 | Bolmer et al. | 570/180 |
| 5,100,572 A | 3/1992 | Merchant | 134/12 |
| 5,104,454 A | 4/1992 | Yokozawa et al. | 134/11 |
| 5,104,564 A | 4/1992 | Lermond et al. | 252/79 |
| 5,118,438 A | 6/1992 | Magid et al. | 134/12 |
| 5,124,062 A | 6/1992 | Stevens | 134/38 |
| 5,137,929 A | 8/1992 | Demmin et al. | 521/99 |
| 5,143,639 A | 9/1992 | Krawack | 134/38 |
| 5,171,902 A | 12/1992 | Krespan et al. | 570/175 |
| 5,176,757 A | 1/1993 | Anton | 134/42 |
| 5,182,042 A | 1/1993 | VanDerPuy | 134/12 |
| 5,194,170 A | 3/1993 | Merchant et al. | 134/12 |
| 5,196,137 A | 3/1993 | Merchant | 134/12 |
| 5,213,621 A | 5/1993 | Ivankovits et al. | |
| 5,213,622 A | 5/1993 | Bohling et al. | |
| 5,679,175 A * | 10/1997 | Hayes et al. | 134/26 |

FOREIGN PATENT DOCUMENTS

| | | |
|---|---|---|
| EP | 0 450 855 A2 | 10/1991 |
| EP | 0 454 490 A2 | 10/1991 |
| FR | 2 198 795 | 4/1974 |
| GB | 2220951 | 1/1990 |
| JP | 53-004360 | 1/1978 |
| JP | 80047952 B | 12/1980 |
| JP | 1058645 A | 12/1983 |
| JP | 63-229185 | of 1988 |
| JP | 139861 | 6/1989 |
| JP | HS-83075 | 3/1990 |
| JP | 2206697 | 8/1990 |
| JP | 2-245203 | 10/1990 |
| JP | 355189 | 8/1991 |
| JP | 173899 | 6/1992 |
| JP | 243503 | 8/1992 |
| WO | 91/09105 | 6/1991 |
| WO | 91/11269 | 8/1991 |
| WO | WO 91/13846 | 9/1991 |
| WO | WO 92/07113 | 4/1992 |
| WO | WO 92/22678 | 12/1992 |
| WO | WO 93/05002 | 3/1993 |
| WO | WO 93/08240 | 4/1993 |

OTHER PUBLICATIONS

B.N. Ellis, "Cleaning and Contamination of Electronics Components and Assemblies", Electrochemical Publications Limited 1986, pp. 171–195.

B.N. Ellis, "Cleaning and Contamination of Electronics Components and Assemblies", Electrochemical Publications Limited 1986, pp. 171–195.

Patent Abstracts of Japan, vol. 17, No. 113 (C–1033) Mar. 9, 1993, including JP–A–04 297 590, Oct. 21, 1992.

Patent Abstracts of Japan, vol. 17, No. 67 (C–1025) Sep. 28, 1992 citing JP–A–04 272 194, Sep. 28, 1992.

Database WPI (Derwent) JP–A–3 285 997 (AN92–038691) Dec. 1991.

* cited by examiner

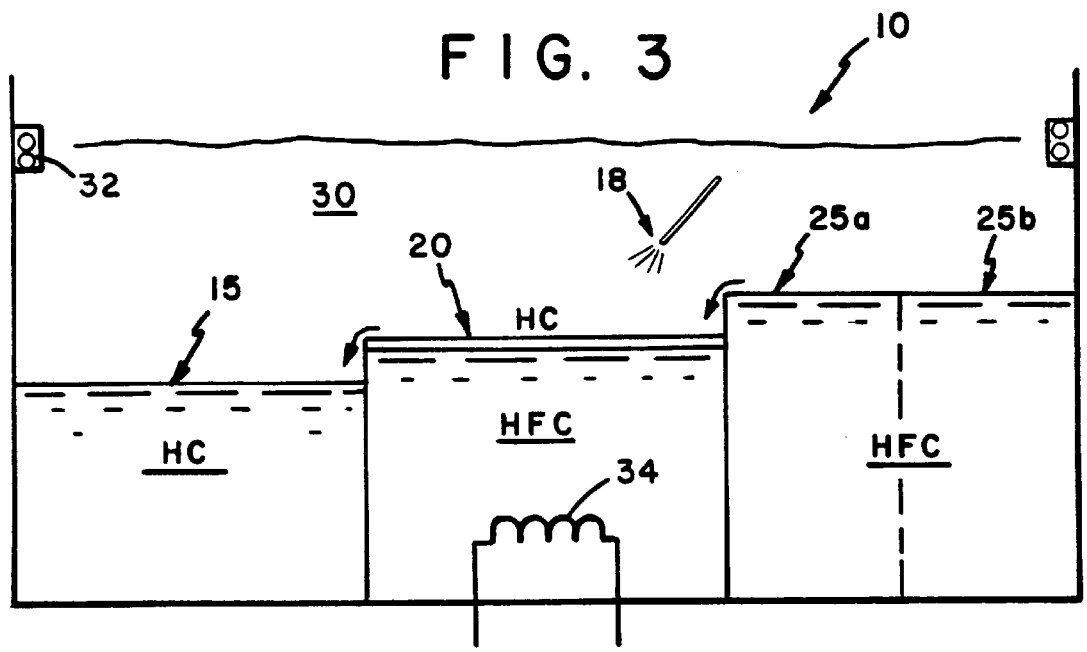
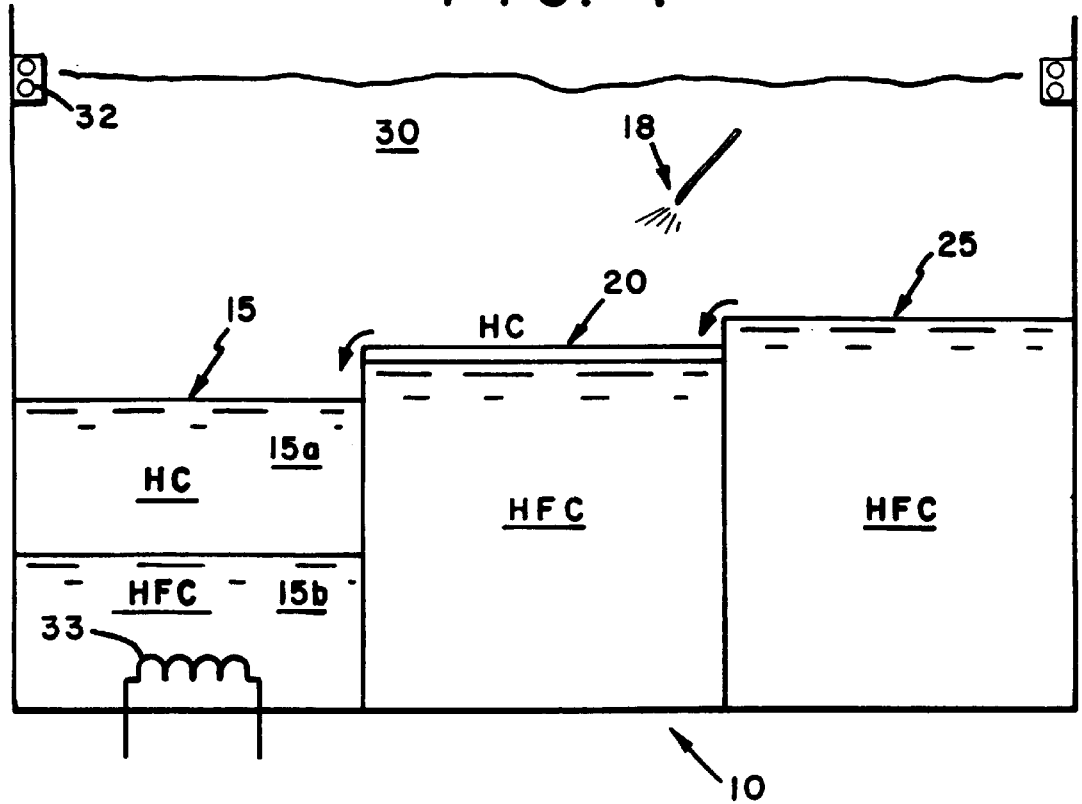

MULTIPLE SOLVENT CLEANING SYSTEM

The present application is a continuation of Ser. No. 08/070,586 filed Jun. 1, 1993, now abandoned, which is a continuation-in-part application of Ser. No. 07/801,199 filed Dec. 2, 1991 now abandoned.

TECHNICAL FIELD

The present invention relates to a method and apparatus of cleaning contaminated articles and apparatus thereof and, more particularly, to the defluxing or degreasing of parts in a non-aqueous cleaning system utilizing an organic solvent for cleaning the parts and a nonflammable fluorocarbon solvent.

BACKGROUND ART

Solvent vapor phase degreasing and defluxing is a process of immersing a soiled substrate (e.g., a printed circuit board or a fabricated metal, glass, ceramic, plastic, or elastomer part or composite) into a boiling, nonflammable liquid such as a chlorocarbon or chlorofluorocarbon fluid or admixture, followed by rinsing the part in a second tank or cleaning zone by immersion or distillate spray with a clean solvent which is the same chlorocarbon or chlorofluorocarbon as used in the first cleaning zone. The parts are then dried by maintaining the cooled part in the condensing vapors until temperature has reached equilibrium.

Solvent cleaning of various types of parts generally occurs in batch, hoist-assisted batch, conveyor batch, or in-line type conveyor degreaser and defluxer equipment. Such in-line conveyor degreaser and defluxer equipment are disclosed in U.S. Pat. No. 5,007,179 (entitled "Cold Air Lock Vapor Seal"), commonly assigned to the assignee of the present invention. Parts may also be cleaned in open top defluxing or degreasing equipment, such as that disclosed in U.S. patent application Ser. No. 07/587,893, filed Sep. 25, 1990, now U.S. Pat. No. 5,075,982, also commonly assigned. In both types of equipment, the entrance and/or exit ends of the equipment are generally in open communication with both the ambient environment and the solvent within the equipment. In order to minimize the loss of solvent from the equipment by either convection or diffusion, a common practice in the art is to use water-cooled or refrigerant-cooled coils which create a condensed vapor blanket over a hot or ambient zone region in the degreaser/defluxer tank, such as disclosed in U.S. Pat. No. 4,261,111 to Rand.

Therefore, in the foregoing solvent vapor phase degreasing process, it is generally known to use a single organic chlorocarbon or chlorofluorocarbon (CFC) fluid to perform the cleaning, rinsing, and drying steps. The use of CFC-113 and Freon type solvents have been, in the past, particularly popular. However, the vapor diffusion thereof into the environment has been implicated in recent scientific studies to be one of many possible contributing causes to the undesirable global depletion of stratospheric ozone, and the production and use of such chlorofluorocarbons is currently regulated and will be phased out in the U.S. by the end of this decade.

In response to environmental concern, hydrochlorofluorocarbon (HCFC) based solvents have been developed in the last few years to provide more environmentally acceptable alternatives to CFC based vapor phase degreasing and defluxing processes. While these materials have been shown to be excellent CFC substitutes for a variety of cleaning applications, they are considered to be an interim replacement to CFCs since they still possess a small, but finite, ozone depletion potential, although it is much lower than that of the CFCs which they are replacing. Hence, these HCFC solvents are also proposed for global phaseout in the near future. It is generally believed that organic solvents which do not contain chlorine, bromine, or iodine atoms will not contribute to stratospheric ozone depletion. However, organic chemicals which do not contain the above halogen atoms, such as hydrocarbons, alcohols, esters, ethers, ketones, etc., usually contain undesirable flammability or reactivity properties. Perfluorinated hydrocarbons and hydrofluorocarbons possess many desirable solvent properties: zero ozone depletion potential; stable, non-reactive, high compatibility with plastics; good water displacement potential; generally non-toxic and inert, and ideally suited to vapor phase solvent cleaning equipment. However, perfluorocarbons have been found to be very poor solvents for many common organic and inorganic soils, e.g., fluxes. Hydrofluorocarbons offer improved but still limited cleaning ability over perfluorocarbons as the amount of fluorine content on the molecule diminishes, but low fluorine-content hydrofluorocarbons may start to exhibit undesirable flammability properties comparable to their hydrocarbon analogs.

European Patent Publication 431,458 published Jun. 12, 1991 teaches aliphatic hydrofluorocarbons of the formula $C_nF_mH_{2n+2-m}$ wherein $4 \leq n \leq 6$ and $6 \leq m \leq 12$ which are useful as cleaning compositions. The reference teaches that the aliphatic hydrofluorocarbon is the active component in the removal of the fluxes, fats and oils, and dust from soiled parts. The reference teaches that in order to increase the solvency for dissolving fluxes, an organic solvent selected from hydrocarbons, alcohols, esters, and ketones may be added in an amount from 0.5 to 30 weight percent to the aliphatic hydrofluorocarbon.

Other types of cleaning processes such as aqueous cleaning exist. Aqueous cleaning generally involves the cleaning of a substrate or a part in an aqueous solution of detergents or surfactants, followed by multiple rinsing steps with purified water. The part is then dried by lengthy evaporation in air or by energy intensive thermal drying machines. This process is not always desirable due to the high energy cost for drying and the additional capital investment and operating cost burden to provide aqueous waste water cleanup required by state and local authorities before sewering to ground water.

Another cleaning process, semi-aqueous cleaning, consists of cleaning a substrate in a hydrocarbon solvent based on, for example, terpenes, esters, or petroleum distillates having a high affinity for oils, waxes, and greases being cleaned from the parts, with or without the aid of a surfactant. The cleaned substrate is rinsed of the high boiling hydrocarbon solvent with multiple rinsing steps using purified water. The hydrocarbon solvent is phase separated back to the wash sump while the aqueous effluent must be processed before sewering to ground water. Consequently, high costs associated with drying energy and with processing waste effluent are evident, similar to the beforementioned aqueous cleaning process. A further drawback is that the hydrocarbon solvent usually possesses a flash point and this must be carefully handled or blanketed with a nonflammable compressed gas such as nitrogen to avoid explosion. Nitrogen gas is much more fugitive than the dense vapors of a fluorocarbon contained in a condensing zone. Furthermore, in a number of applications, while the substrate to be cleaned may be compatible with the hydrocarbon solvent, some plastics or metals may be incompatible with the aqueous rinse solvent, resulting in water absorption or rusting of the substrate.

DISCLOSURE OF THE INVENTION

It is accordingly one object of the present invention to provide a non-aqueous cleaning system for degreasing or defluxing parts in an environmentally safe manner.

Another object of the invention is to provide a non-aqueous cleaning system which does not use water for rinsing, and there does not exist a necessity for aqueous waste water cleanup, and whereby said nonaqueous cleaning system can be used in cases where materials are incompatible with water.

Still a further object is to provide a non-aqueous cleaning system avoiding the need for drying by lengthy evaporation of rinsing fluid in air or by energy intensive thermal drying methods.

Yet a further object is to provide a non-aqueous cleaning system utilizing an organic liquid cleaning agent for cleaning the parts and a rinsing agent having at least a slight solubility for the organic cleaner for rinsing the organic cleaner from the part and which rinsing agent is capable of drying from the part using small amounts of energy.

A non-aqueous cleaning process for removing residual soils or surface contamination from a part, in accordance with the present invention, comprises the steps of introducing the part into contact with an organic cleaning fluid of sufficient solvency to substantially remove said contamination and then removing the part from the organic fluid for rinsing in a rinsing agent having at least some degree of solubility for the organic cleaner to remove same from the substrate. The substrate is immersed in the rinsing agent, sprayed with the rinsing agent or exposed to vapors of the rinsing agent, or any combination of the above. When removed from the vapor, the part is essentially clean and dry. Preferably, the non-aqueous cleaning system of this invention utilizes a two tank cleaning process wherein a first tank contains the organic solvent and a second tank contains the rinsing agent. The parts or substrates to be cleaned may be conveyored from the cleaning tank to the rinsing tank utilizing known conveyor or hoist means. The tanks may be part of conventional or known in-line conveyorized degreasing/defluxing equipment, separate open top defluxing tanks, or open top defluxing tanks modified to contain the cleaning and rinsing tanks or sumps.

In accordance with another feature of the invention, a non-aqueous cleaning process for removing residual soils or surface contamination from parts comprises the steps of introducing the substrate or part into an organic fluid of sufficient solvency to remove residual contamination from the parts. The parts are then rinsed by contact with a second organic solvent of lesser solvency for the soils or surface contamination than exhibited by the first organic fluid solvent but having excellent solvency characteristics towards the first solvent. The second solvent (rinsing agent) may be chosen preferably from the fluorocarbon class of solvents which contain at least one fluorine atom attached to an organic backbone comprised of two or more carbon atoms, with optionally other atoms also attached to the backbone such as oxygen, sulfur, nitrogen, phosphorous, hydrogen, or other halogen atoms; or less preferably the rinsing agent may be chosen from other classes of solvents such as alcohols, ethers, esters, ketones, hydrocarbons, and other non-aqueous media. The parts are then dried by holding under an inert vapor blanket which lessens or mitigates the flammability of the first organic cleaning solvent, or, if flammable, the second rinse solvent, where such flammability masking vapor blanket may be formed by at least one of nitrogen, carbon dioxide, perfluorocarbon, hydrofluorocarbon, or hydrochlorocarbon.

In one embodiment, the cleaning can be done in a system where a solution of the hydrocarbon solvent and the fluorocarbon solvent is mixed together optionally with a surfactant as a solubilizing agent in a degreaser. The fluorocarbon, being more volatile, provides a flammability suppression blanket. The same fluorocarbon would be used in the adjacent rinse sump for an initial immersion or spray liquid rinse followed by a final rinse in the vapor.

In the simplest embodiment, the cleaning can be done in a one sump system where a solution of the hydrocarbon solvent and the lower boiling fluorocarbon solvent is mixed together optionally with a surfactant as a solubilizing agent. The fluorocarbon, being more volatile, provides a flammability suppression blanket, and if the soiled part which has been immersed in the cleaning mixture is held in the condensing fluorocarbon vapors for a sufficiently long period of time, the part can be removed from the vapor phase clean and is dry.

The term "hydrocarbon solvent" as used herein means any solvent which has at least one hydrogen atom and at least one carbon atom.

The organic cleaning solvent can be selected from linear or branched alkyl or alkanol monocarboxylic or dicarboxylic esters having at least one carbon atom in the ester moiety and such solvent most preferably having a flash point greater then 200° F. (93° C.), or less preferably having a flash point greater than 150° F. (66° C.). Useful esters include methyl ester and a mixture of the dimethyl esters of adipic acid, succinic acid, and glutaric acid. The organic fluid may also be selected from linear or cyclic hydrocarbons containing at least one olefinic bond endo or exo to the ring.

The hydrocarbon cleaning agent may comprise pinene and/or camphene, or may comprise terpinene, limonene, terpinolene, terpineol, linaleol, and other related members of the terpene family.

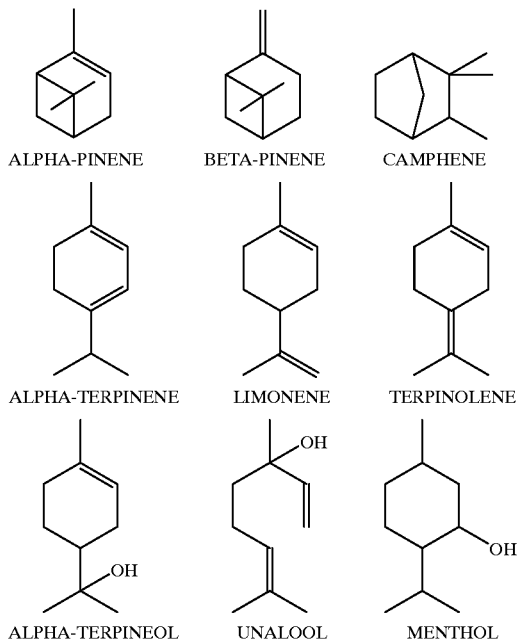

ALPHA-PINENE   BETA-PINENE   CAMPHENE

ALPHA-TERPINENE   LIMONENE   TERPINOLENE

ALPHA-TERPINEOL   UNALOOL   MENTHOL

The organic cleaning solvent may also consist of linear, branched or cyclic hydrocarbons containing $C_{10}$ to $C_{30}$ species.

The organic cleaning fluid may also consist of hydrocarbon containing olefinic moieties which have been substituted with $R_1$–$R_{12}$ groups, wherein 1–2 hydrogen atoms or alkyl groups containing 1–6 carbon atoms or both may comprise the substituted group, i.e.,

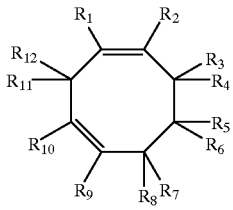

A useful example includes 1,5-dimethylcyclooctadiene.

This organic cleaning fluid may also be comprised of acyclic or cyclic monols or diols defined by the linear structure (1)

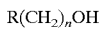 (1)

R=H, hydroxyl
where n is selected from 1 to 20
or the branched structure (2)

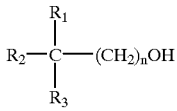 (2)

where n is selected from 1 to 20
or the cyclic structure (3)

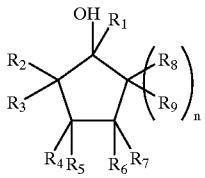 (3)

where $R_1$–$R_9$ is defined as alkyl or hydrogen groups or mixtures thereof, and n is defined as 0 to 6. Useful diols include cyclohexanol and polyethylene glycol (MW 200) (a polyether diol).

The organic fluid may also be comprised of linear, branched, or cyclic mono or polyketones, such as

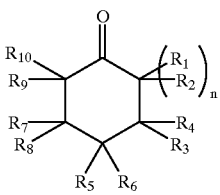

where n is defined as 0 to 6 and $R_1$–$R_{10}$ is defined as alkyl or hydrogen groups or mixtures thereof. A useful cyclic ketone include cyclohexanone.

Other organic cleaning fluids applicable to this invention may be comprised of:
(a) alkyl or aryl nitrites of the formula

where R may be an alkyl group (methyl, ethyl, etc), a phenyl group, or an alkyl substituted phenyl group
(b) an alkylbenzene of the formula

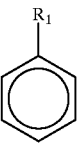

(c) alkyl esters such as diethylphthalate of the formula:

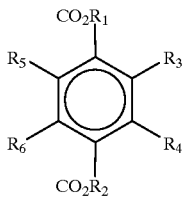

(d) polyether alkanols of the formula:

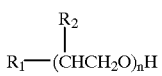

where $R_1$ is chosen from the class of compounds defined by H, alkyl, or hydroxyl groups and $R_2$ is selected from the class of compounds defined by H or alkyl or fluoroalkyl groups.
(e) substituted aromatics of the formula:

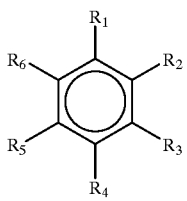

where $R_1$–$R_6$ is chosen from hydrogen, alkyl, fluoroalkyl, or halogen groups and combinations thereof, such as trifluorobenzene.

Such organic cleaning solvent may also comprise mixtures of all the above organic cleaning solvents with fluorocarbons such as linear, branched, or cyclic perfluorocarbons or hydrofluorocarbons or hydrochlorofluorocarbons optionally with substituted oxygen, sulfur, nitrogen, phosphorous or other halogen atoms attached to a carbon atom and optionally with surfactant as a solubilizing agent.

The fluorocarbon rinse solvent may be selected from the class of hydrofluorocarbon or hydrochlorofluorocarbon compounds or mixtures comprised of linear, branched, or cyclic structures having a boiling point of at least 25° C. to 120° C. and such fluorocarbons may be optionally substituted with other functional groups chosen from the class consisting of other halogens and oxygen, sulfur, nitrogen, and phosphorous atoms The preferred hydrofluorocarbon compounds or the hydrochlorofluorocarbon compounds have a certain miscibility for the organic cleaning solvents in the boiling range of at least 25° C. to 120° C. so that at least 2 mole % of the hydrocarbon cleaning solvent is miscible with the hydrofluorocarbon fluid without obtaining phase separation.

The hydrofluorocarbons preferably contain between 3 to 8 carbon atoms, hydrogen, and fluorine in the compound. The boiling point is preferably between 25° C. and 120° C. with at least 60 weight percent fluorine. The compounds preferably have a linear or branched chain.

The present invention provides a composition for cleaning or removing residual soils or surface contamination from a part. The composition comprises a non-azeotropic mixture of hydrocarbon solvent and hydrofluorocarbon solvent. The hydrocarbon component is present in an amount of at least 2 weight percent based on the total composition and is capable of substantially removing the residual soils or surface contamination from the part. The hydrofluorocarbon component has a linear or branched chain structure having 3 to 7 carbon atoms and at least 60 weight percent fluorine, is capable of substantially removing any of the hydrocarbon component remaining on the part, and is less capable than the hydrocarbon component of substantially removing the residual soils or surface contamination from the part.

In contrast to the cleaning compositions of European Patent Publication 431,458 published Jun. 12, 1991 wherein an aliphatic hydrofluorocarbon is the "active" component for the removal of the fluxes, fats and oils, and dust, the hydrocarbon component of the present cleaning compositions is capable of substantially removing the residual soils or surface contamination from a part. The hydrofluorocarbon component of the present cleaning compositions has excellent solvency characteristics toward the hydrocarbon component but has a lesser solvency than the hydrocarbon component for the soils or surface contamination.

Providing flammability suppression can be maintained through the use of suitable vapor blanketing species. The rinse solvent may also be selected from compounds or mixtures comprised of other linear, branched, or cyclic alkyl or aryl alcohols, esters, nitro-, nitrocyclo-, or nitrile compounds, ethers, ketones, hydrocarbons, and other non-aqueous media.

Still other objects and advantages of the present invention will become readily apparent to those skilled in this art from the following detailed description, wherein only the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF DRAWINGS

FIG. 3 is a schematic view depicting a further alternative embodiment of equipment for use in the present invention;

FIG. 4 is a partial schematic view of yet further alternative equipment for practicing the system of the present invention;

BEST MODE FOR CARRYING OUT THE INVENTION

Figure 1:
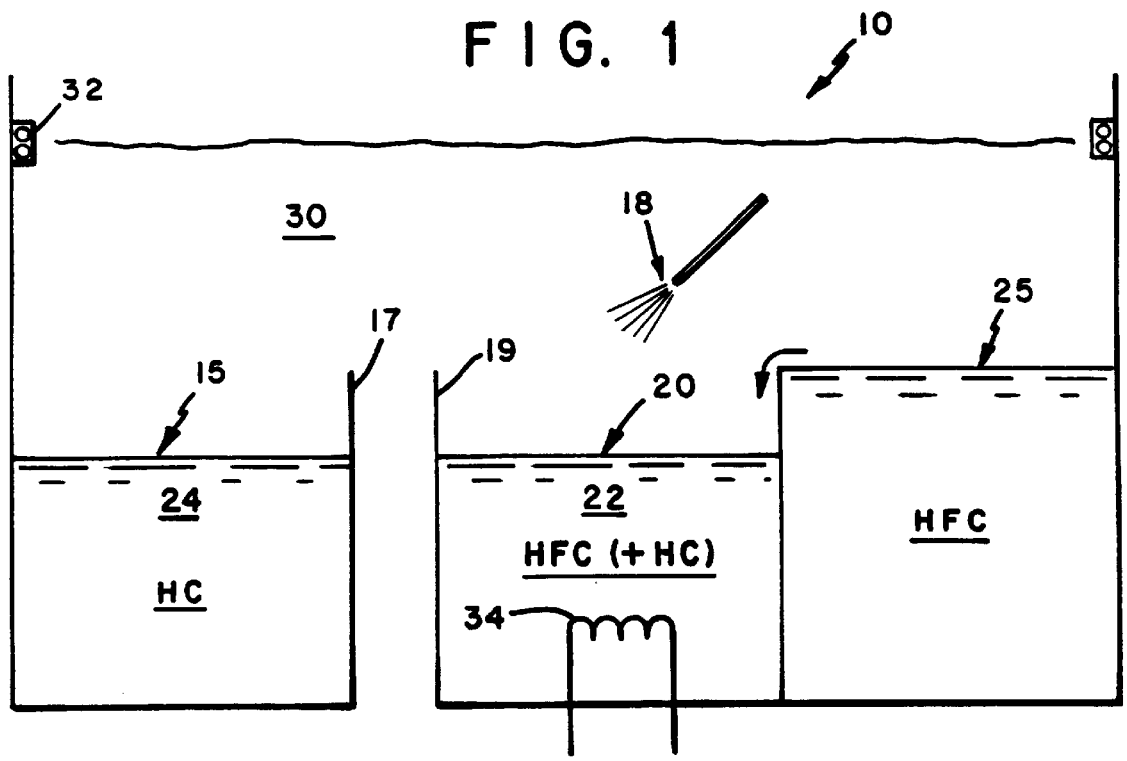
FIG. 1 is a partial schematic view of degreasing or defluxing equipment that may be used in the multi-solvent non-aqueous cleaning system of the present invention.

In its most basic form, the present invention is a novel non-aqueous cleaning process whereby the most attractive features of the semi-aqueous cleaning process and the solvent vapor degreasing solvent process are combined. Specifically, a substrate or part to be cleaned (e.g., a printed circuit board coated with a rosin-based flux, or a metallic or nonmetallic part coated with a petroleum, synthetic, or semi-synthetic based oil or grease) is first washed in a warm or ambient temperature hydrocarbon solvent tending to have a greater affinity for the soil or contaminant on the substrate than a fluorocarbon based solvent. The part is then rinsed by spray or immersion in a second tank or cleaning region containing a nonflammable fluorocarbon solvent, preferably having a lower boiling point than the hydrocarbon solvent. The fluorocarbon solvent has at least slight solubility for the hydrocarbon solvent and therefore rinses the hydrocarbon solvent from the surface of the part. The fluorocarbon solvent is then dried from the part surface by evaporation in a known manner. The benefit of this process is that drying costs are minimized, waste water treatment costs and equipment and capital investments are virtually eliminated, and safety of operation is improved. Further, through the use of hydrofluorocarbon or perfluorocarbon solvents in the rinse and drying steps, the environmental benefit is greatly improved over the chlorocarbon or chlorofluorocarbon solvent systems.

The organic cleaning agent is preferably a hydrocarbon which may be selected from linear or branched alkyl or alkanol monocarboxylic esters having at least six carbon atoms in the aliphatic moiety and at least one carbon atom in the ester moiety.

The organic hydrocarbon fluid may also be selected from linear or cyclic hydrocarbons containing at least one olefinic bond endo or exo to the ring.

The hydrocarbon may also be pinene and/or camphene.

The preferred hydrofluorocarbons include compounds of the empirical formula:

$$C_3H_nF_{8-n}$$

where $1 \leq n \leq 4$

The three carbon hydrofluorocarbons include tetrafluoropropanes (HFC-254), pentafluoropropanes (HFC-245), hexafluoropropanes (HFC-236), and heptafluoropropanes (HFC-227). Preferred three carbon hydrofluorocarbons include tetrafluoropropanes and pentafluoropropanes. Tetrafluoropropanes include the following isomers:

| HFC-254 isomers |
|---|
| $CFH_2CF_2CFH_2$ |
| $CF_2HCF_2CH_3$ |
| $CF_2HCHFCFH_2$ |
| $CF_3CHFCH_3$ |
| $CF_2HCH_2CF_2H$ |
| $CF_3CH_2CFH_2$ |

Pentafluoropropanes include the following isomers:

| HFC-245 isomers |
|---|
| $CF_2HCF_2CFH_2$ |
| $CF_3CF_2CH_3$ |
| $CF_2HCHFCF_2H$ |
| $CF_3CHFCFH_2$ |
| $CF_3CH_2CHF_2$ |

The preferred hydrofluorocarbons include linear or branched compounds of the empirical formula:

$$C_4H_nF_{10-n}$$

where $1 \leq n \leq 5$

The four carbon hydrofluorocarbons include pentafluorobutanes (HFC-365), hexafluorobutanes (HFC-356), heptafluorobutanes (HFC-347), octafluorobutanes (HFC-338), and nonafluorobutanes (HFC-329). Pentafluorobutanes include the following isomers:

| HFC-365 |
|---|
| $CH_3CF(CHF_2)CHF_2$ |

Hexafluorobutanes include the following isomers:

| HFC-356 |
|---|
| $CF_3CH_2CH_2CF_3$ |
| $CF_3CHFCH_2CHF_2$ |
| $CF_3CH_2CHFCHF_2$ |
| $CF_3CF_2CH_2CH_2F$ |
| $CF_3CHFCHFCH_2F$ |
| $CF_3CH_2CF_2CH_2F$ |
| $CHF_2CH_2CF_2CHF_2$ |
| $CHF_2CHFCHFCHF_2$ |
| $CFH_2CF_2CHFCH_2F$ |
| $CHF_2CHFCF_2CH_2F$ |
| $CH_2FCF_2CF_2CH_2F$ |
| $CHF_2CF_2CF_2CH_3$ |
| $CF_3CF_2CHFCH_3$ |
| $CF_3CHFCF_2CH_3$ |

Heptafluorobutanes include the following isomers:

| HFC-347 |
|---|
| $CH_3CF_2CF_2CF_3$ |
| $CH_2FCHFCF_2CF_3$ |
| $CH_2FCF_2CHFCF_3$ |
| $CF_2HCH_2CF_2CF_3$ |
| $CF_2HCHFCHFCF_3$ |
| $CF_3CH_2CHFCF_3$ |
| $CH_2FCF_2CF_2CF_2H$ |
| $CF_2HCHFCF_2CF_2H$ |

Octafluorobutanes include the following isomers:

| HFC-338 |
|---|
| $CF_3CHFCHFCF_3$ |
| $(CF_3)_2CHCHF_2$ |
| $CF_3CF_2CF_2CH_2F$ |
| $CF_3CF_2CHFCHF_2$ |
| $CF_3CHFCF_2CHF_2$ |
| $CF_3CF_2CH_2CHF_2$ |
| $CHF_2CF_2CF_2CHF_2$ |

Nonafluorobutanes include the following isomers:

| HFC-329 |
|---|
| $CF_2HCF_2CF_2CF_3$ |
| $CF_3CHFCF_2CF_3$ |

The preferred hydrofluorocarbons include linear or branched compounds of the empirical formula:

$$C_5H_nF_{12-n}$$

where $1 \leq n \leq 6$

The five carbon hydrofluorocarbons include hexafluoropentanes (HFC-476), heptafluoropentanes (HFC-467), octafluoropentanes (HFC-458), nonfluoropentanes (HFC-449), decafluoropentanes (HFC-43 10), and undecafluoropentanes (HFC-42-11). Heptafluoropentanes include the following isomers:

| HFC-467 |
|---|
| $CH_2FCH_2CF_2CF_2CHF_2$ |
| $CH_2FCF_2CF_2CH_2CHF_2$ |
| $CH_2FCF_2CH_2CF_2CHF_2$ |
| $CH_2FCHFCHFCF_2CHF_2$ |
| $CH_2FCHFCF_2CHFCHF_2$ |
| $CH_2FCF_2CHFCHFCHF_2$ |
| $CHF_2CF_2CF_2CHFCH_3$ |
| $CHF_2CF_2CHFCF_2CH_3$ |
| $CHF_2CHFCF_2CF_2CH_3$ |
| $CHF_2CF_2CHFCH_2CHF_2$ |
| $CHF_2CHFCF_2CH_2CHF_2$ |
| $CHF_2CF_2CH_2CHFCHF_2$ |
| $CHF_2CHFCHFCHFCHF_2$ |
| $CH_2FCHFCF_2CF_2CH_2F$ |
| $CH_2FCF_2CHFCF_2CH_2F$ |
| $CF_3CF_2CF_2CH_2CH_3$ |
| $CF_3CF_2CH_2CF_2CH_3$ |
| $CF_3CF_2CHFCHFCH_3$ |
| $CF_3CH_2CF_2CF_2CH_3$ |
| $CH_3CHFCF_2CHFCH_3$ |
| $CF_3CHFCHFCF_2CH_3$ |
| $CF_3CF_2CHFCH_2CH_2F$ |
| $CF_3CF_2CH_2CHFCH_2F$ |
| $CF_3CHFCF_2CH_2CH_2F$ |
| $CF_3CHFCH_2CF_2CH_2F$ |
| $CF_3CH_2CF_2CHFCH_2F$ |
| $CF_3CH_2CHFCF_2CH_2F$ |
| $CF_3CHFCHFCHFCH_2F$ |
| $CF_3CF_2CH_2CH_2CHF_2$ |
| $CF_3CH_2CH_2CF_2CHF_2$ |
| $CF_3CH_2CF_2CH_2CHF_2$ |
| $CF_3CHFCHFCH_2CHF_2$ |
| $CF_3CHFCH_2CHFCHF_2$ |
| $CF_3CH_2CHFCHFCHF_2$ |
| $CF_3CH_2CH_2CHFCF_3$ |
| $CF_3CH_2CHFCH_2CF_3$ |
| $CH_2FCF_2CF_2CF_2CH_3$ |
| $CH_3CF(CHFCHF_2)CF_3$ |

Octafluoropentanes include the following isomers:

| HFC-458 |
|---|
| $CH_3CFHCF_2CF_2CF_3$ |
| $CH_3CF_2CFHCF_2CF_3$ |
| $CH_3CF_2CF_2CFHCF_3$ |
| $CH_2FCH_2CF_2CF_2CF_3$ |
| $CH_2FCHFCHFCF_2CF_3$ |

-continued

| HFC-458 |
|---|
| $CH_2FCHFCF_2CHFCF_3$ |
| $CH_2FCF_2CH_2CF_2CF_3$ |
| $CH_2FCF_2CHFCHFCF_3$ |
| $CH_2FCF_2CF_2CH_2CF_3$ |
| $CF_2HCH_2CHFCF_2CF_3$ |
| $CF_2HCH_2CF_2CHFCF_3$ |
| $CF_2HCFHCH_2CF_2CF_3$ |
| $CF_2HCHFCHFCHFCF_3$ |
| $CF_2HCHFCF_2CH_2CF_3$ |
| $CF_2HCF_2CH_2CFHCF_3$ |
| $CF_2HCF_2CHFCH_2CF_3$ |
| $CF_3CH_2CH_2CF_2CF_3$ |
| $CF_3CH_2CHFCHFCF_3$ |
| $CF_3CH_2CF_2CH_2CF_3$ |
| $CF_3CHFCH_2CHFCF_3$ |
| $CH_2FCF_2CHFCF_2CF_2H$ |
| $CH_2FCF_2CF_2CHFCF_2H$ |
| $CH_3CF_2CF_2CF_2CF_2H$ |
| $CF_2HCH_2CF_2CF_2CF_2H$ |
| $CF_2HCHFCHFCF_2CF_2H$ |
| $CF_2HCHFCF_2CHFCF_2H$ |
| $CF_2HCF_2CH_2CF_2CF_2H$ |
| $CH_2FCF_2CF_2CF_2CH_2F$ |
| $CH_3CH(CF_2CF_3)CF_3$ |

A most preferred octafluoropentane is $CF_3CH_2CF_2CH_2CF_3$ which is known in the art as HFC-458 mfcf.

Nonafluoropentanes include the following isomers:

| HFC-449 |
|---|
| $CF_3CF_2CHFCH_2CF_3$ |
| $CF_3CH_2CF_2CHFCF_3$ |
| $CF_3CHFCH_2CF_2CF_3$ |
| $CF_3CHFCHFCHFCF_3$ |
| $CF_3CH_2CF_2CF_2CHF_2$ |
| $CF_3CHFCHFCF_2CHF_2$ |
| $CF_3CF_2CH_2CF_2CHF_2$ |
| $CF_3CHFCF_2CHFCHF_2$ |
| $CF_3CF_2CHFCHFCHF_2$ |
| $CF_3CF_2CF_2CH_2CHF_2$ |
| $CF_3CF_2CF_2CHFCH_2F$ |
| $CF_3CF_2CHFCF_2CH_2F$ |
| $CF_3CHFCF_2CF_2CH_2F$ |
| $CF_3CF_2CF_2CF_2CH_3$ |
| $CHF_2CF_2CF_2CHFCHF_2$ |
| $CHF_2CF_2CHFCF_2CHF_2$ |
| $CHF_2CF_2CF_2CF_2CH_2F$ |
| $CHF_2CH(CHF_2)CF_2CF_3$ |

Decafluoropentanes include the following isomers:

| HFC-43-10 |
|---|
| $CH_2FCF_2CF_2CF_2CF_3$ |
| $CF_2HCHFCF_2CF_2CF_3$ |
| $CF_2HCF_2CHFCF_2CF_3$ |
| $CF_2HCF_2CF_2CHFCF_3$ |
| $CF_3CH_2CF_2CF_2CF_3$ |
| $CF_3CF_2CHFCHFCF_3$ |
| $CF_3CHFCF_2CHFCF_3$ |
| $CF_3CF_2CH_2CF_2CF_3$ |
| $CF_2HCF_2CF_2CF_2CF_2H$ |
| $CHF_2CF(CHF_2)CF_2CF_3$ |

Undecafluoropentanes include the following isomers:

| HFC-42-11 |
|---|
| $CF_3CF_2CF_2CF_2CF_2H$ |
| $CF_3CF_2CF_2CFHCF_3$ |
| $CF_3CF_2CFHCF_2CF_3$ |
| $CHF_2CF_2CF(CF_3)_2$ |

The preferred hydrofluorocarbons include linear or branched compounds of the empirical formula:

$$C_6H_nF_{14-n}$$

where $1 \leq n \leq 7$

The six carbon hydrofluorocarbons include heptafluorohexanes (HFC-587), octafluorohexanes (HFC-578), nonafluorohexanes (HFC-569), decafluoropentanes (HFC-55-10), undecafluorohexanes (HFC-54-11), dodecafluorohexanes (HFC-53-12), and tridecafluorohexanes (HFC-52-13).

Heptafluorohexanes include the following isomers:

| HFC-587 |
|---|
| $CH_3CH_2CH_2CF_2CF_2CF_3$ |
| $CH_3CH_2CFHCFHCF_2CF_3$ |
| $CH_3CH(CHFCH_2CF_3)CF_3$ |

Octafluorohexanes include the following isomers:

| HFC-578 |
|---|
| $CH_3CHFCF_2CHFCHFCF_3$ |
| $CH_2FCHFCH_2CF_2CHFCF_3$ |
| $CF_2HCHFCF_2CF_2CHFCF_2H$ |
| $CF_3CF_2CH_2CH_2CF_2CF_3$ |
| $CH_3CF(CF_2H)CHFCHFCF_3$ |
| $CH_3CF_2CF(CF_3)CF_2CH_3$ |

Nonafluorohexanes include the following isomers:

| HFC-569 |
|---|
| $CF_3CH_2CH_2CHFCF_2CF_3$ |
| $CF_3CH_2CH_2CF_2CHFCF_3$ |
| $CF_3CF_2CH_2CHFCH_2CF_3$ |
| $CF_3CHFCHFCHFCH_2CF_3$ |
| $CF_3CH_2CF_2CHFCH_2CF_3$ |
| $CF_3CHFCH_2CF_2CH_2CF_3$ |
| $CF_3CHFCH_2CH_2CF_2CF_3$ |
| $CF_3CHFCHFCH_2CHFCF_3$ |
| $(CF_3CH_2)_2CHCF_3$ |
| $CF_3CF_2CF_2CH_2CH_2CHF_2$ |
| $CF_3CF_2CHFCHFCH_2CHF_2$ |
| $CF_3CHFCF_2CHFCH_2CHF_2$ |
| $CF_3CF_2CH_2CF_2CH_2CHF_2$ |
| $CF_3CHFCHFCF_2CH_2CHF_2$ |
| $CF_3CH_2CF_2CF_2CH_2CHF_2$ |
| $CF_3CF_2CHFCH_2CHFCHF_2$ |
| $CF_3CHFCF_2CH_2CHFCHF_2$ |
| $CF_3CF_2CH_2CHFCHFCHF_2$ |
| $CF_3CHFCHFCHFCHFCHF_2$ |
| $CF_3CH_2CF_2CHFCHFCHF_2$ |
| $CF_3CF_2CF_2CHFCH_2CH_2F$ |
| $CF_3CF_2CHFCF_2CH_2CH_2F$ |
| $CF_3CHFCF_2CF_2CH_2CH_2F$ |
| $CF_3CF_2CF_2CH_2CHFCH_2F$ |

-continued

HFC-569

CF$_3$CF$_2$CHFCHFCHFCH$_2$F
CF$_3$CHFCF$_2$CHFCHFCH$_2$F
CF$_3$CF$_2$CH$_2$CF$_2$CHFCH$_2$F
CH$_3$CF(CF$_3$)CHFCHFCF$_3$
CHF$_2$CF$_2$CF$_2$CHFCH$_2$CHF$_2$
CHF$_2$CF$_2$CHFCF$_2$CH$_2$CHF$_2$
CHF$_2$CHFCF$_2$CF$_2$CH$_2$CHF$_2$
CF$_3$CF$_2$CHFCH$_2$CHFCHF$_2$
CHF$_2$CF$_2$CHFCHFCHFCHF$_2$
CHF$_2$CHFCF$_2$CHFCHFCHF$_2$
CHF$_2$CF$_2$CH$_2$CF$_2$CHFCHF$_2$
CHF$_2$CF$_2$CHFCH$_2$CF$_2$CHF$_2$
CHF$_2$CF$_2$CF$_2$CF$_2$CH$_2$CH$_2$F
CHF$_2$CF$_2$CF$_2$CHFCHFCH$_2$F
CHF$_2$CF$_2$CHFCF$_2$CHFCH$_2$F
CHF$_2$CHFCF$_2$CF$_2$CHFCH$_2$F
CHF$_2$CF$_2$CF$_2$CH$_2$CF$_2$CH$_2$F
CHF$_2$CF$_2$CHFCHFCF$_2$CH$_2$F
CHF$_2$CHFCF$_2$CHFCF$_2$CH$_2$F
CHF$_2$CF$_2$CH$_2$CF$_2$CF$_2$CH$_2$F
CHF$_2$CHFCHFCF$_2$CF$_2$CH$_2$F
CHF$_2$CH$_2$CF$_2$CF$_2$CF$_2$CH$_2$F
CF$_2$HCF$_2$CF$_2$CF$_2$CHFCH$_3$
CF$_2$HCF$_2$CF$_2$CHFCF$_2$CH$_3$
CHF$_2$CF$_2$CHFCF$_2$CF$_2$CH$_3$
CHF$_2$CHFCF$_2$CF$_2$CF$_2$CH$_3$
CH$_2$FCF$_2$CF$_2$CF$_2$CF$_2$CH$_3$
CH$_2$FCF$_2$CF$_2$CF$_2$CHFCH$_2$F
CH$_2$FCF$_2$CF$_2$CHFCF$_2$CH$_2$F
CF$_3$CHFCHFCF$_2$CHFCH$_2$F
CF$_3$CH$_2$CF$_2$CF$_2$CHFCH$_2$F
CF$_3$CF$_2$CHFCH$_2$CF$_2$CH$_2$F
CF$_3$CHFCF$_2$CH$_2$CF$_2$CH$_2$F
CF$_3$CF$_2$CH$_2$CHFCF$_2$CH$_2$F
CF$_3$CHFCHFCHFCF$_2$CH$_2$F
CF$_3$CH$_2$CF$_2$CFHCF$_2$CH$_2$F
CF$_3$CHFCH$_2$CF$_2$CF$_2$CH$_2$F
CF$_3$CH$_2$CHFCF$_2$CF$_2$CH$_2$F
CF$_3$CHFCH$_2$CF$_2$CHFCHF$_2$
CF$_3$CH$_2$CHFCF$_2$CHFCHF$_2$
CF$_3$CF$_2$CH$_2$CH$_2$CF$_2$CHF$_2$
CF$_3$CHFCHFCH$_2$CF$_2$CHF$_2$
CF$_3$CH$_2$CF$_2$CH$_2$CF$_2$CHF$_2$
CF$_3$CHFCH$_2$CHFCF$_2$CHF$_2$
CF$_3$CH$_2$CH$_2$CF$_2$CF$_2$CHF$_2$
CF$_3$CH$_2$CHFCHFCF$_2$CHF$_2$
CF$_3$CF$_2$CF$_2$CF$_2$CH$_2$CH$_3$
CF$_3$CF$_2$CF$_2$CHFCHFCH$_3$
CF$_3$CF$_2$CHFCH$_2$CHFCH$_3$
CF$_3$CHFCF$_2$CF$_2$CHFCH$_3$
CF$_3$CF$_2$CF$_2$CH$_2$CF$_2$CH$_3$
CF$_3$CF$_2$CHFCHFCF$_2$CH$_3$
CF$_3$CHFCF$_2$CHFCF$_2$CH$_3$
CF$_3$CF$_2$CH$_2$CF$_2$CF$_2$CH$_3$
CF$_3$CHFCHFCF$_2$CF$_2$CH$_3$
CF$_3$CH$_2$CF$_2$CF$_2$CF$_2$CH$_3$

Decafluoropentanes include the following isomers:

HFC-55-10

CF$_3$CF$_2$CF$_2$CH$_2$CH$_2$CF$_3$
CF$_3$CF$_2$CHFCHFCH$_2$CF$_3$
CF$_3$CHFCF$_2$CHFCH$_2$CF$_3$
CF$_3$CF$_2$CH$_2$CF$_2$CH$_2$CF$_3$
CF$_3$CHFCHFCF$_2$CH$_2$CF$_3$
CF$_3$CH$_2$CF$_2$CF$_2$CH$_2$CF$_3$
CF$_3$CHFCH$_2$CHFCF$_2$CF$_3$
CF$_3$CHFCH$_2$CF$_2$CHFCF$_3$
CF$_3$CHFCHFCH$_2$CF$_2$CF$_3$
CF$_3$CHFCHFCHFCHFCF$_3$
CF$_3$CF$_2$CH$_2$CH$_2$CF$_2$CF$_3$
CF$_3$CF$_2$CF$_2$CHFCH$_2$CHF$_2$

HFC-55-10

CF$_3$CF$_2$CHFCF$_2$CH$_2$CHF$_2$
CF$_3$CHFCF$_2$CF$_2$CHFCHF$_2$
CF$_3$CF$_2$CF$_2$CH$_2$CHFCHF$_2$
CF$_3$CF$_2$CHFCHFCHFCHF$_2$
CF$_3$CHFCF$_2$CHFCHFCHF$_2$
CF$_3$CF$_2$CH$_2$CF$_2$CHFCHF$_2$
CF$_3$CHFCHFCF$_2$CHFCHF$_2$
CF$_3$CH$_2$CF$_2$CF$_2$CHFCHF$_2$
CF$_3$CF$_2$CHFCH$_2$CF$_2$CHF$_2$
CF$_3$CHFCF$_2$CH$_2$CF$_2$CHF$_2$
CF$_3$CF$_2$CH$_2$CHFCF$_2$CHF$_2$
CF$_3$CHFCHFCHFCF$_2$CHF$_2$
CF$_3$CH$_2$CF$_2$CHFCF$_2$CHF$_2$
CF$_3$CHFCH$_2$CF$_2$CF$_2$CHF$_2$
CF$_3$CH$_2$CHFCF$_2$CF$_2$CHF$_2$
CF$_3$CH$_2$CHFCF$_2$CF$_2$CHF$_2$
CF$_3$CF$_2$CF$_2$CF$_2$CH$_2$CH$_2$F
CF$_3$CF$_2$CF$_2$CHFCHFCH$_2$F
CF$_3$CF$_2$CHFCF$_2$CHFCH$_2$F
CF$_3$CHFCF$_2$CF$_2$CHFCH$_2$F
CF$_3$CF$_2$CF$_2$CH$_2$CF$_2$CH$_2$F
CF$_3$CF$_2$CHFCHFCF$_2$CH$_2$F
CF$_3$CHFCF$_2$CHFCF$_2$CH$_2$F
CF$_3$CF$_2$CH$_2$CF$_2$CF$_2$CH$_2$F
CF$_3$CHFCHFCF$_2$CF$_2$CH$_2$F
CHF$_2$CF$_2$CHFCF$_2$CF$_2$CH$_2$F
CF$_3$CF$_2$CF$_2$CF$_2$CHFCH$_3$
CF$_3$CF$_2$CF$_2$CHFCF$_2$CH$_3$
CF$_3$CF$_2$CHFCF$_2$CF$_2$CH$_3$
CF$_3$CHFCF$_2$CF$_2$CF$_2$CH$_3$
CHF$_2$CF$_2$CF$_2$CHFCHFCHF$_2$
CHF$_2$CF$_2$CHFCF$_2$CHFCHF$_2$
CHF$_2$CHFCF$_2$CF$_2$CHFCHF$_2$
CHF$_2$CF$_2$CF$_2$CH$_2$CF$_2$CHF$_2$
CHF$_2$CF$_2$CHFCHFCF$_2$CHF$_2$
CHF$_2$CF$_2$CF$_2$CF$_2$CF$_2$CHF$_2$
CHF$_2$CF$_2$CF$_2$CF$_2$CHFCH$_2$F
CHF$_2$CF$_2$CF$_2$CHFCF$_2$CH$_2$F
CHF$_2$CF$_2$CHFCF$_2$CF$_2$CH$_2$F
CHF$_2$CHFCF$_2$CF$_2$CF$_2$CH$_2$F
CH$_2$FCF$_2$CF$_2$CF$_2$CF$_2$CH$_2$F
CHF$_2$CF$_2$CF$_2$CF$_2$CF$_2$CH$_3$
CF$_3$CF$_2$CF$_2$CF$_2$CHFCH$_3$
CF$_3$CF$_2$CF$_2$CHFCF$_2$CH$_3$
CF$_3$CF$_2$CHFCF$_2$CF$_2$CH$_3$
CF$_3$CHFCF$_2$CF$_2$CF$_2$CH$_3$

Undecafluorohexanes include the following isomers:

HFC-54-11

CH$_3$(CF$_2$)$_4$CF$_3$
CH$_3$CF(CF$_3$)CF$_2$CF$_2$CF$_3$
(CF$_3$)$_2$CHCH$_2$CF$_2$CF$_3$
CH$_2$FCHF(CF$_2$)$_3$CF$_3$
CH$_2$FCF$_2$CHFCF$_2$CF$_2$CF$_3$
CH$_2$FCF$_2$CF$_2$CHFCF$_2$CF$_3$
CH$_2$F(CF$_2$)$_3$CHFCF$_3$
CF$_2$HCH$_2$(CF$_2$)$_3$CF$_3$
CF$_2$HCHFCHFCF$_2$CF$_2$CF$_3$
CF$_2$HCHFCF$_2$CHFCF$_2$CF$_3$
CF$_2$HCHFCF$_2$CF$_2$CHFCF$_3$
CF$_2$HCF$_2$CH$_2$CF$_2$CF$_2$CF$_3$
CF$_2$HCF$_2$CHFCHFCF$_2$CF$_3$
CF$_2$HCF$_2$CHFCF$_2$CHFCF$_3$
CF$_2$HCF$_2$CF$_2$CH$_2$CF$_2$CF$_3$
CF$_2$HCF$_2$CF$_2$CHFCHFCF$_3$
CF$_2$H(CF$_2$)$_3$CH$_2$CF$_3$
CF$_3$CH$_2$CHFCF$_2$CF$_2$CF$_3$
CF$_3$CH$_2$CF$_2$CHFCF$_2$CF$_3$
CF$_3$CHFCF$_2$CF$_2$CH$_2$CF$_3$
CF$_3$CF$_2$CF$_2$CH$_2$CHFCF$_3$
CF$_3$CHFCHFCHFCF$_2$CF$_3$
CF$_3$CHFCF$_2$CHFCHFCF$_3$

HFC-54-11

CF$_3$CHFCF$_2$CH$_2$CF$_2$CF$_3$
CF$_3$CF$_2$CH$_2$CHFCF$_2$CF$_3$
CH$_2$F(CF$_2$)$_4$CF$_2$H
CF$_2$HCHF(CF$_2$)$_3$CF$_2$H
CF$_2$HCF$_2$CHFCF$_2$CF$_2$CF$_2$H

A preferred undecafluorohexane is (CF$_3$)$_2$CHCH$_2$CF$_2$CF$_3$ which is known in the art as HFC-54-11 mmzf. Dodecafluorohexanes include the following isomers:

HFC-53-12

CF$_3$CF$_2$CHFCHFCF$_2$CF$_3$
CF$_3$CF$_2$CF$_2$CH$_2$CF$_2$CF$_3$
CF$_3$CHFCF$_2$CF$_2$CHFCF$_3$
CF$_3$CF$_2$CHFCF$_2$CHFCF$_3$
CF$_3$CHFCHFCF$_2$CF$_2$CF$_3$
CF$_3$CF$_2$CF$_2$CF$_2$CH$_2$CF$_3$
CF$_3$CF$_2$CF$_2$CF$_2$CHFCHF$_2$
CF$_3$CF$_2$CF$_2$CHFCF$_2$CHF$_2$
CF$_3$CF$_2$CHFCF$_2$CF$_2$CHF$_2$
CF$_3$CHFCF$_2$CF$_2$CF$_2$CHF$_2$
CF$_3$CF$_2$CF$_2$CF$_2$CF$_2$CH$_2$F
CF$_2$HCF$_2$CF$_2$CF$_2$CF$_2$CHF$_2$
CHF$_2$CF$_2$CH(CF$_3$)CF$_2$CF$_3$
(CF$_3$)$_2$CHCFHCF$_2$CF$_3$

A preferred dodecafluorohexane is (CF$_3$)$_2$CHCHFCF$_2$CF$_3$ which is known in the art as HFC-53-12 mmze. Tridecafluorohexanes include the following isomers:

HFC-52-13

CF$_2$HCF$_2$CF$_2$CF$_2$CF$_2$CF$_3$
CF$_3$CHFCF$_2$CF$_2$CF$_2$CF$_3$
CF$_3$CF$_2$CHFCF$_2$CF$_2$CF$_3$
CHF$_2$CF$_2$CF(CF$_3$)CF$_2$CF$_3$

Other preferred hydrofluorocarbons include linear or branched compounds of the empirical formula:

C$_7$H$_n$F$_{16-n}$ where $1 \leq n \leq 8$.

Representative examples of this class are:
CH$_3$CH$_2$CH$_2$CHFCF$_2$CF$_2$CF$_3$
CH$_3$CHFCH$_2$CF$_2$CHFCF$_2$CF$_3$
CH$_3$(CF$_2$)$_5$CH$_3$
CH$_3$CH$_2$(CF$_2$)$_4$CF$_3$
CF$_3$CH$_2$CH$_2$(CF$_2$)$_3$CF$_3$
CH$_2$FCF$_2$CHF(CF$_2$)$_3$CF$_3$
CF$_3$CF$_2$CF$_2$CHFCHFCF$_2$CF$_3$
CF$_3$CF$_2$CF$_2$CHFCF$_2$CF$_2$CF$_3$
CH$_3$CH$_2$CH$_2$CHFCF(CF$_3$)$_2$
CH$_3$CH(CF$_3$)CF$_2$CF$_2$CF$_2$CH$_3$
CH$_3$CF(CF$_3$)CH$_2$CFHCF$_2$CF$_3$
CH$_3$CF(CF$_2$CF$_3$)CHFCF$_2$CF$_3$
CH$_3$CH$_2$CH(CF$_3$)CF$_2$CF$_2$CF$_3$
CHF$_2$CF(CF$_3$)(CF$_2$)$_3$CHF$_2$
CHF$_2$CF(CF$_3$)(CF$_2$)$_3$CF$_3$ Other preferred hydrofluorocarbons include linear or branched compounds of the empirical formula C$_8$H$_n$F$_{18-n}$ where $1 \leq n \leq 9$.

Representative examples of this class are:
CH$_3$CH$_2$CH$_2$CH$_2$CF$_2$CF$_2$CF$_2$CF$_3$
CH$_3$(CF$_2$)$_6$CH$_3$
HCF$_2$(CF$_2$)$_6$CF$_2$H
CF$_3$(CF$_2$)$_6$CF$_2$H
CHF$_2$CF(CF$_3$)(CF$_2$)$_4$CF$_3$
CH$_3$CH$_2$CH(CF$_3$)CF$_2$CF$_2$CF$_2$CF$_2$
CH$_3$CF(CF$_2$CF$_3$)CHFCF$_2$CF$_2$CF$_3$
CH$_3$CH$_2$CH$_2$CHFC(CF$_3$)$_2$CF$_3$
CH$_3$C(CF$_3$)$_2$CF$_2$CF$_2$CF$_2$CH$_3$
CH$_3$CH$_2$CH$_2$CF(CF$_3$)CF(CF$_3$)$_2$
CH$_2$FCF$_2$CF$_2$CHF(CF$_2$)$_3$CF$_3$ The hydrofluorocarbon component may also be an azeotropic mixture of hydrofluorocarbon and another component as long as the azeotropic mixture is capable of substantially removing any hydrocarbon component remaining on the part and is less capable than the hydrocarbon component of substantially removing the residual soils or surface contamination from the part. Examples of preferred azeotropic mixtures include CF$_3$CH$_2$CF$_2$CH$_2$CF$_3$ and one of the following components: methanol, ethanol, isopropanol, n-propanol, t-butanol, isobutanol, n-butanol, t-amyl alcohol, trichloroethylene, and perchloroethylene.

FIG. 1 is a partial schematic illustration of one type of apparatus which can be used in the present process. Therein, a vessel (10) is divided into three sumps: a cleaning sump 15, a wash sump 20, and a rinsing sump 25. The cleaning compartment 15 is separated by one or more walls 17, 19 from the second compartment 20, which contains a fluorocarbon fluid 22 heated to its boiling point by a heater 34, to provide a nonflammable condensing vapor blanket 30 or a flammability suppression blanket over all the sumps 15, 20, 25 common to vessel 10. Compartment 20 also provides an area where the bulk of the soil and organic cleaning agent can be washed from the substrate by either immersing into the fluorocarbon fluid contained in compartment 20 or by placement in a spray stream 18 of pure fluorocarbon condensate, whereby the contaminated liquid drops into the sump below. The cleaning compartment 15 is adapted to contain a body of the organic cleaning solvent 24 tailored for the cleaning application, which could be an organic hydrocarbon as noted above and in the examples below for heavy duty cleaning, or a mixture of an organic hydrocarbon with a milder solvent such as a fluorocarbon for less rigorous cleaning applications (where compatibility with the substrate may be of more important consideration). The washing compartment 20 is adapted to contain a rinsing agent 22 having at least slight solubility for the cleaning solvent 24. As used throughout this specification, "slight solubility" of the rinsing fluorocarbon solvent for the hydrocarbon cleaning solvent is defined as having $\geq 2$ mole % of the hydrocarbon is soluble in fluorocarbon solvent. An appropriate rinsing agent 22 and one preferred in the present invention is a fluorocarbon based solvent as noted above and in the examples below. Optionally, a second rinsing compartment 25, which is at a cooler temperature than compartment 20, may be provided downstream from the first rinsing compartment 20, and is also adapted to contain the fluorocarbon solvent rinsing agent. The purpose of compartment 25 is to provide a final immersion rinse for the substrate to remove trace residues of soil or cleaning solvent and also to cool the substrate so that the part is rinsed with pure condensing vapor in the vapor zone 30. The vapor zone 30 is formed above the respective compartments 15,20,25 and a cooling coil 32 of a type known in the art (such as disclosed in U.S. Pat. No. 4,261,111 to Rand) defines the uppermost extent of the vapor zone 32 to condense vapor for return of condensate to compartment 25.

It is to be noted that the hydrocarbon cleaning solvent 24 and fluorocarbon rinsing fluid 22 may be chosen for their respective mutual solubilities such that some means of physical separation such as phase separation may be employed to remove built-up soils as well as to recycle clean organic solvent back to its originating sump. Therefore, with reference to FIG. 1, it is to be noted that a U-tube phase separator (not shown) or weir or skimmer may be used in conjunction with compartment 20 to separate or remove condensed hydrocarbon which will float on top of the fluorocarbon, and this separation device (not shown) may be arranged so that the excess hydrocarbon fluid will flow back to the cleaning tank 15 from the rinsing tank 20.

The vessel 10 of FIG. 1 is depicted as an open top type of defluxer or degreaser. However, it is to be understood that the vessel 10, in its schematic form, may also characterize an in-line type of degreaser or defluxer wherein conveyor means (not shown) may be used to successively convey the parts from the cleaning sump 15 to the rinsing sumps 20 and 25.

Figure 2:
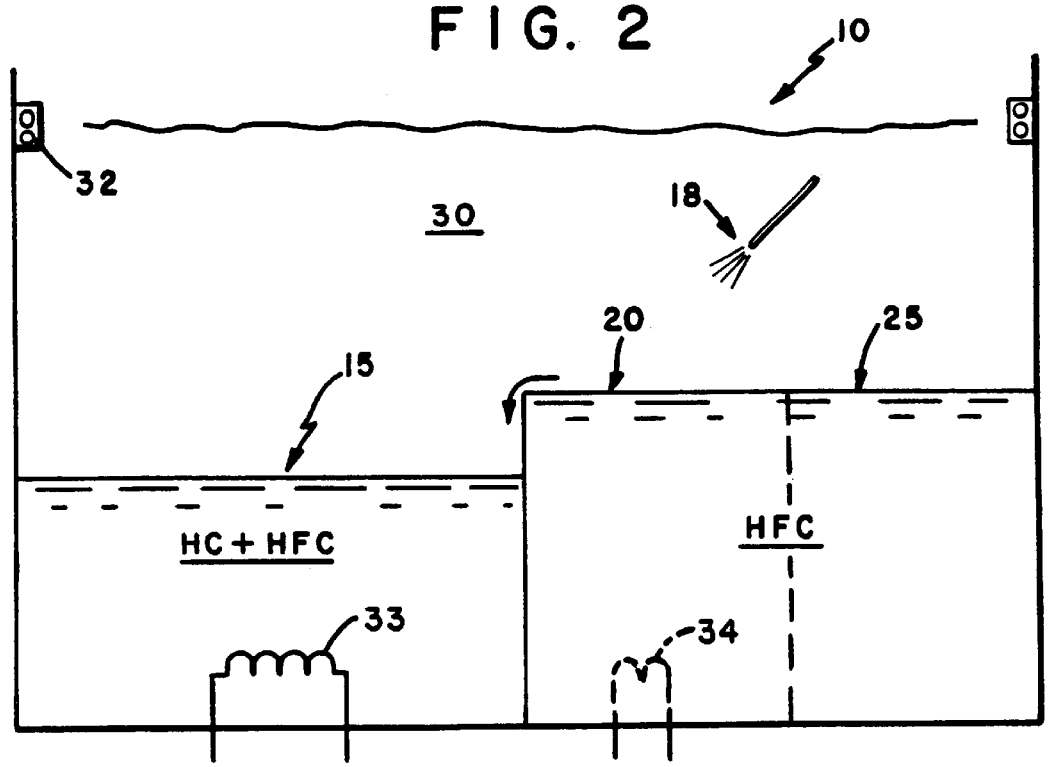
FIG. 2 is a schematic view depicting an alternative embodiment of equipment that may be used in the present invention.

In FIG. 2, the organic cleaning fluid in cleaning tank 15 may optionally be mixed with a fluorocarbon type solvent. The cleaning fluid in this case would be warmed to a sufficient temperature to boil off the fluorocarbon, where the boiling point of the fluorocarbon should be at least 10° C. lower than that of the organic hydrocarbon fluid. The mixture is heated with coils 33 so that the resulting vapor 10 zone 30 immediately overlying the hydrocarbon is essentially a fluorocarbon-based nonflammable or flammability suppression vapor zone to minimize the possibility of explosion. The cleaning fluid mixture may or may not require a surfactant additive to ensure phase homogeneity between the organic hydrocarbon and the fluorocarbon solvents. The fluorocarbon which was boiled off would be maintained at a constant concentration in compartment 15 by either returning the vapor condensate back to this compartment and/or pumping fluid from the rinse compartment(s) 20,25 back to this sump through control with a volume or level-sensing transducer (not shown). In this variation of FIG. 1, the boiling rinse sump 20 may not be necessary, or it could function purely as a second rinse sump at any intermediate temperature between compartment 15 and compartment 25. In the three-sump option where sump 20 supplies the fluorocarbon vapor to form the nonflammable blanket for vessel 10, sump 20 may be heated with heating coils 34 and heating coils 33 may not be necessary. In the two-sump option where sump 15 supplies the fluorocarbon vapor to form the nonflammable blanket 30 for vessel 10, heating coil 33 would be preferred and heating coil 34 may not be necessary. In the two-sump option where sump 15 supplies the fluorocarbon vapor to form the nonflammable blanket 30 for vessel 10, sump 20 may not be necessary and sump 25 would provide a cool liquid rinse immersion prior to bringing the cleaned substrate into the vapor condensing zone 30 for a final pure condensate rinse.

In FIG. 3, the rinse sump 20 may contain a saturated solution of the hydrocarbon based cleaning fluid and the fluorocarbon based rinsing solvent. The fluids are selected so that the hydrocarbon phase separates at some low concentration (i.e., less than 10 mole %) in the fluorocarbon and floats to the top of the more dense fluorocarbon, providing a cascading effect back into the cleaning sump 15. The rinse sump(s) 25a or 25b may also in turn cascade pure rinse solvent into sump 20 to maintain its level and also to directionally provide a flow skimming action to sweep the separated organic layer towards the boil sump 15.

In FIG. 4, the boil sump 15 contains both hydrocarbon and fluorocarbon based solvents of sufficient immiscibility to form layered cleaning zones 15a and 15b. The advantage of this arrangement is that the heating coil 33, which provides the. nonflammable vapor blanket for vessel 10, is now immersed in a fluorocarbon-rich phase which lessens the possibility of accidental fire if the liquid in the sump drops below its intended level. Furthermore, the boiling fluorocarbon liquid now provides an agitation action to the top less dense organic hydrocarbon phase to assist in the cleaning performance. As in FIG. 3, the fluorocarbon rinse solvent and the hydrocarbon cleaning solvent can be cascaded or pumped back to their respective sumps to ensure that sump liquid volumes are maintained.

Figure 5:
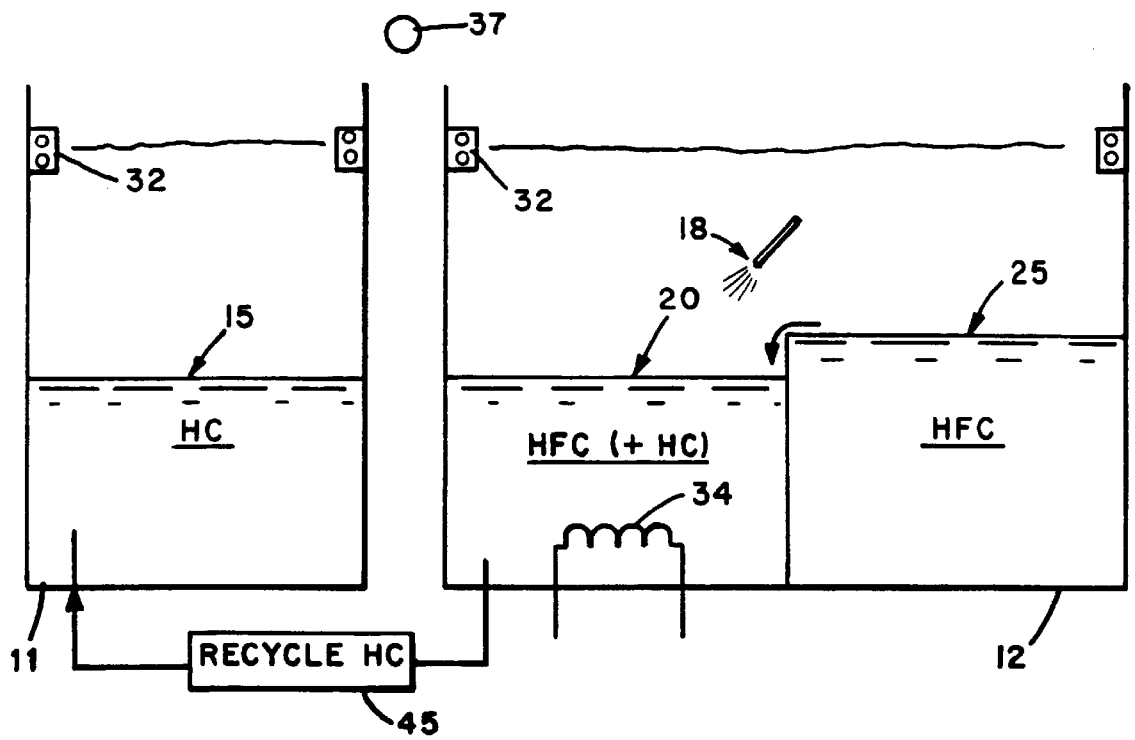
FIG. 5 is another embodiment of equipment for use in the present invention.

In FIG. 5, the hydrocarbon cleaning zone 15 may be separated from the rinsing zones 20 and 25 by being provided within separate structures 11 and 12. This configuration is intended to provide the ability to retrofit conventional solvent vapor degreasing or defluxing batch-type equipment such as represented by vessel 12 in FIG. 5 with the cleaning process of this invention. The carry-over of organic solvent from vessel 11 to vessel 12 can be reduced by mechanical devices such as an air knife 37. Nitrogen or any other nonflammable compressed gas may be introduced into the vapor zone overlying the hydrocarbon sump 15 to reduce hydrocarbon flammability or the danger of explosion, as typical with many types of conventional semi-aqueous (organic cleaning/aqueous rinse) cleaning processes. In the fluorocarbon boil sump 20, the residual hydrocarbon carried over from cleaning sump 15 may be mechanically separated out as described in FIG. 1 and recycled back with a pump 45 (as schematically depicted) in view of the physical separation of the two cleaning zones which would prevent cascading as in the previous embodiments.

Figure 6:
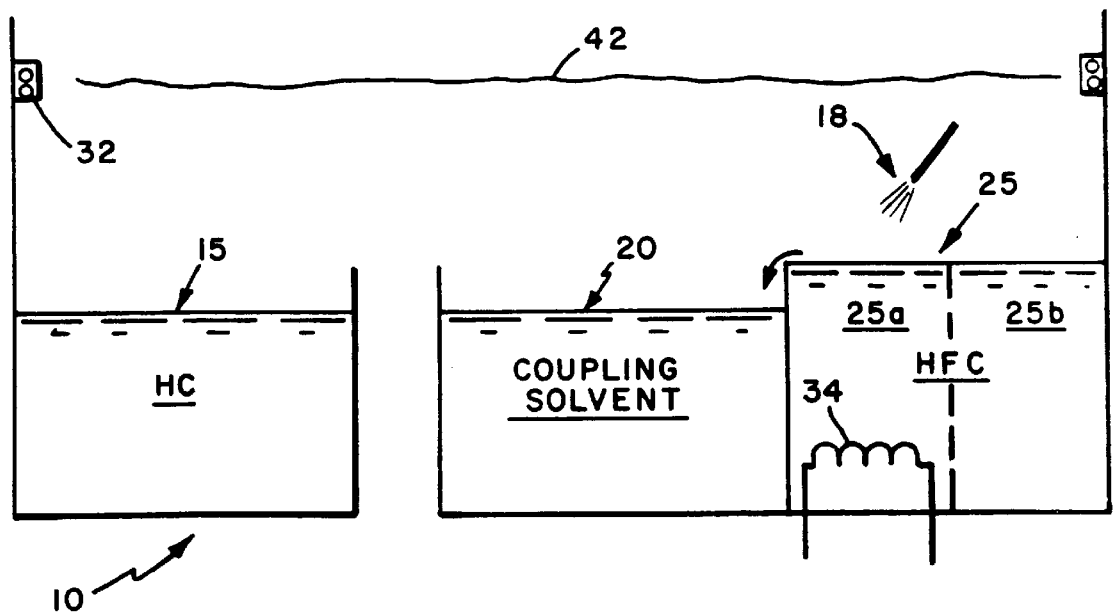
FIG. 6 is a further embodiment of equipment for use in the present invention.

In FIG. 6, it is presumed that the organic cleaning solvent in cleaning sump 15 is immiscible or of low miscibility with the fluorocarbon-based rinsing solvent in rinsing sump 25. To prevent mixing of these solvents together and thereby potentially recontaminating the cleaned substrate, the first rinsing zone is provided with a coupling solvent (such as an alkanol like butanol, or another fluorochemical such as trifluorobenzene, or any other type of hydrocarbon) wherein the fluorocarbon solvent is miscible with the coupling solvent. Preferably, the fluorocarbon solvent has a lower boiling point than either the organic cleaning solvent or the coupling solvent. In this case, the fluorocarbon in sump 25 primarily serves the purpose of blanketing the flammable liquids in sumps 15 and 20 with a nonflammable vapor, and the level of liquid in rinse sump 20 which is comprised primarily of coupling solvent is maintained by makeup with fluorocarbon liquid from sump 25. The substrate which has been rinsed in coupling solvent sump 20 is either subjected to a final immersion rinse in sumps(s) 25a and/or 25b or is held in the fluorocarbon condensing vapor zone 42 for a final rinse, which can be suitably accomplished since the coupling solvent is miscible with the fluorocarbon solvent.

EXAMPLES

The following examples are used to demonstrate the unexpected cleaning performance observed when a soiled coupon is first immersed in an organic cleaning solvent followed by a rinse with a fluorochemical solvent. In these studies, stainless steel coupons were coated with various commercial petroleum, semi-synthetic, and synthetic oils. The commercial petroleum oils are paraffinic, straight or branched chain saturated hydrocarbons. All of these oils are used in the metalworking industry for cooling and lubricating purposes. The synthetic oils contain synthetic polymer with additives containing fatty acids and amines. The semi-synthetic oils are mixtures of the petroleum and synthetic oils. The cleaning process used for tests to demonstrate this invention consisted of 30 second immersion of a coupon in the organic cleaning solvent followed by a 30 second immersion in the fluorochemical solvent and a 30 second rinse above the liquid in the cooling coil zone with the condensing vapors of the fluorochemical solvent. The amount of soil on the coupon before and after cleaning was determined with a commercial $CO_2$ coulometer, which measures to microgram sensitivity the amount of organic residue, expressed in carbon units, on a surface. The sample of residue on the coupon is introduced into a combustion furnace via a sample boat, and is combusted in oxygen atmosphere at a temperature of 650° C. The resulting $CO_2$ and other combustion products pass through scrubbers to remove any interfering halogens, sulfur, nitrogen oxides and water. The gas then passes to the coulometer cell which contains an indicating solution. As the gas stream passes through the solution $CO_2$ is quantitatively absorbed, and reacts with a chemical in the solution to produce a titratable acid. An electric current is then automatically adjusted to neutralize the solution, the total current is integrated, and the results displayed as micrograms of carbon. The sensitivity of this method is +/−0.01 micrograms carbon, which is one of the most sensitive methods to reproducibly analyze carbon components on a surface. Since all oils cleaned in this invention are primarily organic in nature, the monitoring of carbon content is an excellent way to determine with high reproducibility and sensitivity the amount of organic soil on a substrate.

Example One

A ($C_9$ to $C_{11}$) methyl ester is used as the organic solvent. Spectroscopic characterization indicated a small quantity of a branched component. HFC 52-13 is a branched hydrofluorocarbon ($C_6F_{13}H$) used as the fluorocarbon rinsing agent. The methyl ester is effective in removing petroleum based oil from metal coupons at room temperature, but a thin film of the methyl ester solvent remained after the cleaning process. The oil is not able to be cleaned from the surface of the coupon by HFC 52-13. However, the process of cleaning with the methyl ester, rinsing with HFC 52-13 followed by a rinse by the fluorocarbon condensing vapors was highly effective in removing greater than 99.9% of the thin film of high boiling ester from the metal coupon without leaving a measurable trace of oil contaminant. Effectiveness of cleaning was assessed by weight measurements. In each of the examples below, blank coupons were determined to contain about 10 μg carbon on the surface.

Example Two

A dibasic ester cleaning solvent mixture was prepared in the laboratory by synthesizing the dimethyl esters of adipic acid, succinic acid, and glutaric acid in the proportions of 10 wt %/22 wt %/68 wt %, respectively. Soiled coupons were immersed in a mixture of the dibasic esters with HFC-365 ($CF_3CH_2CF_2CH_3$) at 56° C. for 30 seconds, followed by a 30 second immersion in HFC-365 at ambient temperature and a 30 second vapor rinse with HFC-365. The following results were noted:

| | | | Micrograms (ug) Carbon on the Surface | |
|---|---|---|---|---|
| Expt. | Oil on Substrate | Cleaning Method | Before Cleaning | After Cleaning |
| (a) | petroleum | this invention | 819 | 11 |
| (b) | petroleum | no HFC rinse | 819 | 495 |
| (c) | petroleum | no ester rinse | 819 | 70 |
| (d) | synthetic | this invention | 508 | 10 |
| (e) | synthetic | no HFC rinse | 508 | 724 |
| (f) | synthetic | no ester rinse | 508 | 499 |

In the experiments with the petroleum and synthetic oils, using an organic cleaning step followed by a fluorochemical vapor rinse step resulted in completely cleaning the coupon surface (>99.9% removal of carbon). However, in experiments (b) and (e), significant amount of carbon remained on the surface when the coupon was cleaned by a 30 second immersion in dibasic ester only followed by a 30 second drying in air without the HFC vapor rinse. In experiments (c) and (f), significant amount of carbon residue remained on the surface when the coupon was cleaned by a 30 second immersion in HFC-365 followed by a 30 second drying in air without using the ester cleaning step. This example demonstrates that a fluorochemical vapor rinse step is required to completely clean a soiled surface which has been immersed in either a dibasic ester or a mixture of a dibasic ester with fluorochemical, and neither the ester alone nor the fluorochemical solvent alone is sufficient to completely clean the surface.

Example Three

Soiled coupons were immersed in a 50/50 volume % mixture of cyclohexanone, a cyclic ketone, and HFC-365, a hydrofluorocarbon, for 30 seconds at 57–59° C. followed by a 30 second immersion in HFC-365 at ambient temperature and a 30 second vapor rinse with HFC-365. The following results were noted:

| | | | Micrograms (ug) Carbon on the Surface | |
|---|---|---|---|---|
| Expt. | Oil on Substrate | Cleaning Method | Before Cleaning | After Cleaning |
| (a) | petroleum | this invention | 819 | 8.7 |
| (b) | petroleum | no HFC rinse | 819 | 1064 |
| (c) | petroleum | no ketone cleaning | 819 | 70 |
| (d) | synthetic | this invention | 508 | 7.7 |
| (e) | synthetic | no HFC rinse | 508 | 1475 |
| (f) | synthetic | no ketone cleaning | 508 | 499 |
| (g) | mineral oil | this invention | 950 | 7.5 |
| (h) | synthetic | this invention | 1033 | 14.9 |

In the experiments (a) through (f) using an organic cleaning step followed by a fluorochemical vapor rinse step resulted in completely cleaning the coupon surface (>99.9% removal of carbon). However, in experiments (b) and (e), significant amount of carbon remained on the surface when the coupon was cleaned by a 30 second immersion in cyclohexanone only followed by a 30 second drying in air without the HFC vapor rinse. In experiments (c) and (f), significant amount of carbon residue remained on the surface when the coupon was cleaned by a 30 second immersion in HFC-365 followed by a 30 second drying in air without using the ketone cleaning step. This example demonstrates that a fluorochemical vapor rinse step is required to completely clean a soiled surface which has been immersed in either a ketone (cyclic or acyclic) with fluorochemical, and neither the ketone alone nor the fluorochemical solvent alone is sufficient to completely clean the surface.

Example Four

Soiled coupons were immersed in a 50/50 volume % mixture of liquid cyclohexanol, a cyclic alkanol, and HFC-365, a hydrofluorocarbon, for 30 seconds at 57–59° C. followed by a 30 second immersion in HFC-365 at ambient temperature and a 30 second vapor rinse with HFC-365. The following results were noted:

| Expt. | Oil on Substrate | Cleaning Method | Micrograms (ug) Carbon on the Surface | |
|---|---|---|---|---|
| | | | Before Cleaning | After Cleaning |
| (a) | petroleum | this invention | 819 | 4 |
| (b) | petroleum | no HFC rinse | 819 | 2397 |
| (c) | petroleum | no alkanol cleaning | 819 | 70 |
| (d) | synthetic | this invention | 508 | 139.7 |
| (e) | synthetic | no HFC rinse | 508 | 1148 |
| (f) | synthetic | no alkanol cleaning | 508 | 499 |
| (g) | mineral oil | this invention | 950 | 12.7 |
| (h) | synthetic | this invention | 1033 | 10.2 |

In the experiments with petroleum oil, using an organic cleaning step followed by a fluorochemical vapor rinse step resulted in completely cleaning the coupon surface (>99.9% removal of carbon). Since cyclohexanol is a fairly poor solvent in cleaning synthetic oil, as shown in experiments (b) and (e), most of the oil and the organic solvent film was able to be removed with the cleaning process of this invention as shown in experiment (d). Additionally, in experiments (b) and (e), a significant amount of carbon remained on the surface when the coupon was cleaned by a 30 second immersion in cyclohexanol only followed by a 30 second drying in air without the HFC vapor rinse. In experiments (c) and (f), significant amount of carbon residue remained on the surface when the coupon was cleaned by a 30 second immersion in HFC-365 followed by a 30 second drying in air without using the alkanol followed by a 30 second drying in air without using the alkanol cleaning step. This example demonstrates that a fluorochemical vapor rinse step is required to completely clean a soiled surface which has been immersed in an alkanol (cyclic or acyclic), and neither the alkanol alone nor the fluorochemical solvent alone is sufficient to completely clean the surface.

Example Five

Soiled coupons were immersed in a 50/50 volume % mixture of liquid 1,-5-dimethylcyclooctadiene, a cyclic olefin, and HFC-365, a hydrofluorocarbon, for 30 seconds at 57–59° C. followed by a 30 second immersion in HFC-365 at ambient temperature and a 30 second vapor rinse with HFC-365. The following results were noted:

| Expt. | Oil on Substrate | Cleaning Method | Micrograms (ug) Carbon on the Surface | |
|---|---|---|---|---|
| | | | Before Cleaning | After Cleaning |
| (a) | petroleum | this invention | 819 | 10.1 |
| (b) | petroleum | no HFC rinse | 819 | 2953 |
| (c) | petroleum | no olefin cleaning | 819 | 70 |
| (d) | synthetic | this invention | 508 | 18.8 |
| (e) | synthetic | no HFC rinse | 508 | 2831 |
| (f) | synthetic | no olefin cleaning | 508 | 499 |
| (g) | mineral oil | this invention | 950 | 10 |
| (h) | synthetic | this invention | 1033 | 15.1 |

In the experiments with petroleum oil and synthetic oil, using an organic cleaning step followed by a fluorochemical vapor rinse step resulted in completely cleaning the coupon surface (>99.8% removal of carbon). However, in experiments (b) and (e), significant amount of carbon remained on the surface when the coupon was cleaned by a 30 second immersion in 1,5-dimethylcyclooctadiene only followed by a 30 second drying in air without the HFC vapor rinse. In experiments (c) and (f), significant amount of carbon residue remained on the surface when the coupon was cleaned by a 30 second immersion in HFC-365 followed by a 30 second drying in air without using the olefin solvent cleaning step. This example demonstrates that a fluorochemical vapor rinse step is required to completely clean a soiled surface which has been immersed in an olefin (cyclic or acyclic), and neither the olefin alone nor the fluorochemical solvent alone is sufficient to completely clean the surface.

Example Six

Soiled coupons were immersed in a 50/50 volume % mixture of liquid benzotrifluoride, a fluorinated aromatic chemical, and HFC-365, a hydrofluorocarbon, for 30 seconds at 57–59° C. followed by a 30 second immersion in HFC-365 at ambient temperature and a 30 second vapor rinse with HFC-365. The following results were noted:

| Expt. | Oil on Substrate | Cleaning Method | Micrograms (ug) Carbon on the Surface | |
|---|---|---|---|---|
| | | | Before Cleaning | After Cleaning |
| (a) | petroleum | this invention | 819 | 13.3 |
| (b) | petroleum | no HFC rinse | 819 | 138 |
| (c) | petroleum | no fl. org. cleaning | 819 | 70 |
| (d) | synthetic | this invention | 508 | 16.1 |
| (e) | synthetic | no HFC rinse | 508 | 1022 |
| (f) | synthetic | no fl. org. cleaning | 508 | 499 |
| (g) | mineral oil | this invention | 950 | 13.7 |
| (h) | synthetic | this invention | 1033 | 127.9 |

In the experiments with petroleum oil and synthetic oil, using an organic cleaning step followed by a fluorochemical vapor rinse step resulted in completely cleaning the coupon surface (>99.8% removal of carbon). However, in experiments (b) and (e), significant amount of carbon remained on the surface when the coupon was cleaned by a 30 second immersion in benzotrifluoride only followed by a 30 second drying in air without the HFC vapor rinse. In experiments (c) and (f), significant amount of carbon residue remained on the surface when the coupon was cleaned by a 30 second immersion in HFC-365 followed by a 30 second drying in air without using the fluoroaromatic cleaning step. This example demonstrates that a fluorochemical vapor rinse step is required to completely clean a soiled surface which has been immersed in a fluorinated aromatic solvent, and neither the fluoroaromatic cleaning solvent alone nor the fluorochemical solvent alone is sufficient to completely clean the surface.

Example Seven

Soiled coupons were immersed in a 50 volume % mixture of polyethylene glycol (MW 200) (a polyether diol) and a methyl ester, and 50 volume % of HFC-365, a hydrofluorocarbon, for 30 seconds at 45–50° C. followed by a 30 second immersion in HFC-365 at ambient temperature and a 30 second vapor rinse with HFC-365. The following results were noted:

| Expt. | Oil on Substrate | Cleaning Method | Micrograms (ug) Carbon on the Surface | |
|---|---|---|---|---|
| | | | Before Cleaning | After Cleaning |
| (a) | petroleum | this invention | 819 | 14 |
| (b) | petroleum | no HFC rinse | 819 | 1917 |
| (c) | petroleum | no PEG/ester cleaning | 819 | 70 |
| (d) | synthetic | this invention | 508 | 11 |
| (e) | synthetic | no HFC rinse | 508 | 1847 |
| (f) | synthetic | no PEG/ester cleaning | 508 | 499 |
| (g) | mineral oil | this invention | 950 | 12 |
| (h) | synthetic | this invention | 1033 | 13 |

In the experiments with petroleum oil and synthetic oil, using an organic cleaning step followed by a fluorochemical vapor rinse step resulted in completely cleaning the coupon surface (>99.8% removal of carbon). However, in experiments (b) and (e), significant amount of carbon remained on the surface when the coupon was cleaned by a 30 second immersion in polyethylene glycol/methyl ester solvent mixture only followed by a 30 second drying in air without the HFC vapor rinse. In experiments (c) and (f), significant amount of carbon residue remained on the surface when the coupon was cleaned by a 30 second immersion in HFC-365 followed by a 30 second drying in air without using the glycol/ester solvent cleaning step. This example demonstrates that a fluorochemical vapor rinse step is required to completely clean a soiled surface which has been immersed in a mixture of glycol with an ester, and neither the mixed organic solvent alone nor the fluorochemical solvent alone is sufficient to completely clean the surface.

Example Eight

Soiled coupons were immersed in either a methyl ester, or a mixture of polyethylene glycol (MW 200)(a polyether diol) and a methyl ester, for 30 seconds at 57–59° C. followed by a 30 second immersion in either HCFC-123, a hydrochlorofluorocarbon, or HFC-52-13, a highly fluorinated alkane, at ambient temperature and a 30 second vapor rinse with either fluorochemical solvent. The following results were noted:
  (a) The synthetic oil and the grease Valvoline were both removed from metal coupons to better than 99.9% using the PEG-200/methyl ester cleaning solvent mixture with HCFC-123 as the rinse solvent in the process of this invention.
  (b) Same as (a) with 123 replaced by HFC-52-13 which is $(CF_3)_2CHCF_2CF_2CF_3$.

Example Nine

Soiled coupons were immersed in a 50/50 volume % mixture of BIOACT EC-7, a commercial blend of terpenes and nonionic surfactants, and HFC-365, a hydrofluorocarbon, for 30 seconds at 57–59° C. followed by a 30 second immersion in HFC-365 at ambient temperature and a 30 second vapor rinse with HFC-365. The following results were noted:

| Expt. | Oil on Substrate | Cleaning Method | Micrograms (ug) Carbon on the Surface | |
|---|---|---|---|---|
| | | | Before Cleaning | After Cleaning |
| (a) | petroleum | this invention | 819 | 15.3 |
| (b) | petroleum | no HFC rinse | 819 | 2221 |
| (c) | petroleum | no terpene cleaning | 819 | 36 |
| (d) | synthetic | this invention | 508 | 13.6 |
| (e) | synthetic | no HFC rinse | 508 | 2272 |
| (f) | synthetic | no terpene cleaning | 508 | 27.9 |
| (g) | mineral oil | this invention | 950 | 12 |
| (h) | mineral oil | no terpene cleaning | 950 | 94 |
| (i) | synthetic | this invention | 1033 | 13 |
| (j) | synthetic | no terpene cleaning | 1033 | 340 |

In the experiments with petroleum oil and synthetic oil, using an organic cleaning step followed by a fluorochemical vapor rinse step resulted in virtually complete cleaning of the coupon surface (>99.6% removal of carbon). However, in experiments (b) and (e), significant amount of carbon remained on the surface when the coupon was cleaned by a 30 second immersion in the terpene solvent mixture only followed by a 30 second drying in air without the HFC vapor rinse. In experiments (c) and (f), significant amount of carbon residue remained on the surface when the coupon was cleaned by a 30 second immersion in HFC-365 followed by a 30 second drying in air without using the terpene solvent cleaning step. This example demonstrates that a fluorochemical vapor rinse step is required to completely clean a soiled surface which has been immersed in a terpene solvent, and neither the terpene solvent alone nor the fluorochemical solvent alone is sufficient to completely clean the surface.

Example Ten

Soiled coupons were immersed in 50/50 volume % mixture of liquid cyclohexanone, a cyclic ketone, and HFC-365, a hydrofluorocarbon, for 30 seconds at 56–59° C. followed by a 30 second immersion in a nonflammable constant-boiling blend of 5% HCFC-141b, a hydrochlorofluorocarbon, and 90% HFC-365, a hydrofluorocarbon, at ambient temperature and a 30 second vapor rinse with the condensing azeotropic vapors of HCFC-141b/HFC-365. The following results were noted:

| Expt. | Oil on Substrate | Cleaning Method | Micrograms (ug) Carbon on the Surface | |
|---|---|---|---|---|
| | | | Before Cleaning | After Cleaning |
| (a) | petroleum | this invention | 819 | 18 |
| (b) | petroleum | no HFC/HCFC blend rinse | 819 | 2221 |
| (c) | petroleum | no ketone cleaning | 819 | 70 |

-continued

| Expt. | Oil on Substrate | Cleaning Method | Micrograms (ug) Carbon on the Surface | |
|---|---|---|---|---|
| | | | Before Cleaning | After Cleaning |
| (d) | synthetic | this invention | 508 | 29 |
| (e) | synthetic | no HFC/HCFC blend rinse | 508 | 2272 |
| (f) | synthetic | no ketone cleaning | 508 | 499 |
| (g) | mineral oil | this invention | 950 | 15 |
| (h) | synthetic | this invention | 1033 | 25 |

In the experiments with petroleum oil and synthetic oil, using an organic cleaning step followed by a fluorochemical blend of HCFC and HFC vapor rinse step resulted in virtually complete cleaning of the coupon surface (>99.8% removal of carbon). However, in experiments (b) and (e), significant amount of carbon remained on the surface when the coupon was cleaned by a 30 second immersion in the ketone cleaning solvent only followed by a 30 second drying in air without the HCFC/HFC vapor rinse. In experiments (c), (f), (h) and (j), more carbon residue remained on the surface when the coupon was cleaned by a 30 second immersion in HCFC-141b/HFC-365 azeotrope followed by a 30 second drying in air than in the dual solvent process of this invention using the terpene solvent cleaning step. This example demonstrates that even when a strong fluorochemical rinse solvent such as a blend containing HFCF-141b is used, the combined organic (ketone) cleaning step followed by a fluorochemical rinse step produces greater cleaning than if a ketone solvent alone or a fluorochemical solvent alone is used to clean the substrate.

Example Eleven

Soiled coupons were immersed in a 50/50 volume % mixture of liquid cyclohexanone, a cyclic ketone, and HFC-365/FC-72 (95:5 by weight) for 30 seconds at 56–59° C. followed by a 30 second immersion in a non-segregating blend of 5% FC-72, a perfluorocarbon, and 95% HFC-365, a hydrofluorocarbon, at ambient temperature and a 30 second vapor rinse with the condensing azeotropic vapors of FC-72/HFC-365. The following results were noted:

| Expt. | Oil on Substrate | Cleaning Method | Micrograms (ug) Carbon on the Surface | |
|---|---|---|---|---|
| | | | Before Cleaning | After Cleaning |
| (a) | petroleum | this invention | 819 | 22 |
| (b) | petroleum | no ketone cleaning | 819 | 44.3 |
| (c) | synthetic | this invention | 508 | 20.1 |
| (d) | synthetic | no ketone cleaning | 508 | 453 |
| (e) | mineral oil | this invention | 950 | 21.3 |
| (f) | mineral oil | no ketone cleaning | 950 | 550 |
| (g) | synthetic | this invention | 1033 | 20.4 |
| (h) | synthetc | no ketone cleaning | 1033 | 426 |

In the above experiments, using an organic cleaning step followed by a fluorochemical vapor rinse step resulted in complete cleaning of the coupon surface (99.9% removal of carbon). More carbon residue remained on the surface when the coupon was cleaned by a 30 second immersion in the mixture of FC-72/HFC-365 followed by a 30 second drying in air without using the cyclohexanone solvent cleaning step. This example demonstrates that a fluorochemical vapor rinse step is required to completely clean a soiled surface which has been immersed in a ketone solvent, and neither the ketone solvent alone nor the fluorochemical solvent alone is sufficient to completely clean the surface. In addition, it is well known that perfluorocarbons such as FC-72 are very poor solvents for oils, but when blended with hydrochlorocarbons or even hydrochlorofluorocarbons in the vapor or immersion rinse step of this process combined with an organic cleaning step, the dual solvent process produces completely clean coupons which could not be completely cleaned by the individual solvent themselves.

Example Twelve

Soiled coupons were immersed in liquid cyclohexanol, a cyclic alcohol, which was not admixed with the HFC prior to cleaning (as in the previous examples). The coupons were immersed for 30 seconds at 56–59° C. followed by a 30 second immersion in HFC-365, a hydrofluorocarbon, at ambient temperature and a 30 second vapor rinse with the condensing azeotropic vapors of HFC-365. The following results were noted:

| Expt. | Oil on Substrate | Cleaning Method | Micrograms (ug) Carbon on the Surface | |
|---|---|---|---|---|
| | | | Before Cleaning | After Cleaning |
| (a) | petroleum | this invention | 819 | 18.5 |
| (b) | synthetic | this invention | 508 | 166 |
| (c) | mineral oil | this invention | 950 | 20.9 |
| (d) | synthetic | this invention | 033 | 22.4 |

In this experiment, the cleaning ability of the organic cleaner segregated from the HFC was demonstrated. The results are within experimental error to those of Example 4, where the admixed organic/solvent system was evaluated. Interestingly, in this example he HFC/organic mixture in the cleaning sump cleaned better than if the cleaning sump contained only organic solvent (cyclohexanol).

Example Thirteen

Soiled coupons were immersed in liquid cyclohexanone, a cyclic ketone, which was not admixed with the HFC prior to cleaning (as in the previous examples). The coupons were immersed for 30 seconds at 56–59° C. followed by a 30 second immersion in HFC-365, a hydrofluorocarbon, at ambient temperature and a 30 second vapor rinse with the condensing azeotropic vapors of HFC-365. The following results were noted:

| Expt. | Oil on Substrate | Cleaning Method | Micrograms (ug) Carbon on the Surface | |
|---|---|---|---|---|
| | | | Before Cleaning | After Cleaning |
| (a) | petroleum | this invention | 819 | 11.3 |
| (b) | synthetic | this invention | 508 | 12.2 |
| (c) | mineral oil | this invention | 950 | 11.7 |
| (d) | synthetic | this invention | 1033 | 10.3 |

In this experiment, the cleaning ability of the organic cleaner segregated from the HFC was demonstrated. The results are within experimental error to those of Example 12, where the admixed organic/solvent system was evaluated.

It will be readily seen by one of ordinary skill in the art that the present invention fulfills all of the objects set forth above. After reading the foregoing specification, one of ordinary skill will be able to effect various changes, substitutions of equivalents and various other aspects of the invention as broadly disclosed herein. It is therefore intended that the protection granted hereon be limited only by the definition contained in the appended claims and equivalents thereof.

What is claimed is:

1. A non-aqueous cleaning process for removing residual soils or surface contamination from a part, by immersing the part in an organic cleaning fluid of sufficient solvency to substantially remove the soils or contamination from the surface of the part, rinsing the part with a rinsing solvent to remove the organic cleaning fluid, and drying the part, wherein said process comprises the steps of:

(a) immersing the part in the organic cleaning fluid in a cleaning compartment, said cleaning fluid selected from the group consisting of dicarboxylic esters, terpenes, $C_{10}$ to $C_{30}$ hydrocarbons, alkyl nitriles, aryl nitriles, ketones having the formula:

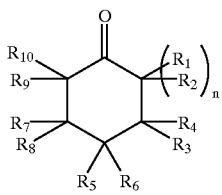

where n is defined as 0 to 6 and $R_1$–$R_{10}$ is defined as alkyl or hydrogen groups or mixtures thereof, substituted aromatics of the formula:

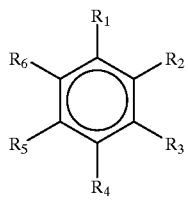

where $R_1$–$R_6$ is chosen from hydrogen, alkyl, fluoroalkyl, or halogen groups and combinations thereof.

(b) transferring the part from the cleaning compartment to a rinsing compartment containing a hydrofluorocarbon rinsing solvent having a miscibility for organic cleaning fluids in the boiling range of at least 25° C. to 120° C. such that at least 2 mole percent of the organic cleaning fluid is miscible with the hydrofluorocarbon rinsing solvent without obtaining phase separation, and said hydrofluorocarbon rinsing solvent having a lesser solvency for the soils or contamination from the surface of the part than the organic cleaning fluid, said rinsing solvent comprising a hydrofluorocarbon compound consisting of hydrogen, carbon, and fluorine; and (c) providing a flammability-suppression blanket consisting essentially of substantially pure hydrofluorocarbon vapor over the cleaning and rinsing compartments.

2. The process according to claim 1, wherein the organic cleaning fluid comprises a mixture of:
(a) an organic component; and
(b) a linear or branched hydrofluorocarbon component structure having 3 to 8 carbon atoms and at least 60 weight percent fluorine, wherein said organic component is present in an amount of at least 2 mole percent based on the total of said organic cleaning fluid.

3. The process according to claim 1, wherein the rinsing solvent consists essentially of one or more linear or branched hydrofluorocarbon compounds having 3 to 8 carbon atoms and at least 60 weight percent of fluorine, and having a boiling point of from 25° C. to 125° C.

4. The process according to claim 1, wherein the cleaning compartment contains an organic cleaning solvent mixed with a hydrofluorocarbon solvent and wherein the mixture is heated to a sufficient temperature to boil off at least some of the hydrofluorocarbon having a boiling point less than the hydrocarbon solvent to form the flammability-suppression blanket.

5. The process according to claim 1, wherein said rinsing solvent comprises a hydrofluorocarbon selected from:

(1) compounds with the empirical formula:

where $1 \leq n \leq 4$ (2) linear or branched compounds of the empirical formula:

where $1 \leq n \leq 5$ (3) linear or branched compounds of the empirical formula:

where $1 \leq n \leq 6$ (4) linear or branched compounds of the empirical formula:

where $1 \leq n \leq 7$ (5) linear or branched compounds of the empirical formula:

where $1 \leq n \leq 8$ (6) linear or branched compounds of the empirical formula:

where $1 \leq n \leq 9$.

6. The process according to claim 1, wherein said rinsing compartment comprises a top and a bottom and wherein said hydrofluorocarbon rinsing solvent and said organic cleaning fluid are selected such that any organic cleaning fluid present in the rinsing compartment containing the hydrofluorocarbon rinsing solvent separate at a predetermined low concentration from the hydrofluorocarbon and floats to the top of the rinsing compartment to provide a cascading effect of organic cleaning fluid back into the cleaning compartment.

7. The process according to claim 6, further comprising the step of providing a second rinsing compartment containing substantially entirely only a hydrofluorocarbon and providing a cascading effect of substantially pure hydrofluorocarbon rinse solvent into the rinsing compartment to maintain a predetermined level thereof and to provide a flow skimming action to sweep the separated organic cleaning fluid back toward the cleaning compartment.

8. The process according to claim 1, wherein the process is carried out in an apparatus in which the cleaning compartment is housed in a structure which is separate from a structure containing the rinsing compartment.

* * * * *

UNITED STATES PATENT AND TRADEMARK OFFICE
CERTIFICATE OF CORRECTION

PATENT NO. : 6,355,113 B1
DATED : March 12, 2002
INVENTOR(S) : Nalewajek, David

It is certified that error appears in the above-identified patent and that said Letters Patent is hereby corrected as shown below:

Title page,
Item [75], Inventors, "Gary J. Zyhowski, Carol Stream, IL" should read
-- Gary J. Zyhowski, Lancaster, NY --;
"Hepburn Ingham, Buffalo, NY" should read -- Hepburn Ingham, Des Plaines, IL --;
and "Joel Edward Rodgers, Convent Station, NJ" should read
-- Joel Edward Rodgers, Palos Verdes Estates, CA --.
Item [56], References Cited, FOREIGN PATENT DOCUMENTS, "63-229185 of 1988" should read -- 63-229185 1988 --.
OTHER PUBLICATIONS, please delete the first instance of the B.N. Ellis . . . publication.

Column 4,
Line 26, "then" should read -- than --.

Column 5,
Line 65, "nitrites" should read -- nitriles --.

Column 10,
Line 17, "nonfluoropentanes" should read -- nonafluoropentanes --.
Line 18, "(HFC-43 10)" should read -- (HFC-43-10) --.

Column 16,
Line 59, "carbon is soluble" should read -- carbon soluble --.

Column 17,
Lines 35 and 36, "vapor 10 zone" should read -- vapor zone --.

Column 20,
Lines 7 and 46, "Micrograms (ug)" should read -- Micrograms (μg) --.

Column 21,
Line 23, "Micrograms (ug)" should read -- Micrograms (μg) --.
Line 63, "1,-5-dimethylcyclooctadiene," should read -- 1,5-dimethylcyclooctadiene, --.

Column 22,
Lines 4 and 45, "Micrograms (ug)" should read -- Micrograms (μg) --.

Column 23,
Line 20, "Micrograms (ug)" should read -- Micrograms (μg) --.

UNITED STATES PATENT AND TRADEMARK OFFICE
CERTIFICATE OF CORRECTION

PATENT NO. : 6,355,113 B1
DATED : March 12, 2002
INVENTOR(S) : Nalewajek, David

It is certified that error appears in the above-identified patent and that said Letters Patent is hereby corrected as shown below:

Column 24,
Lines 13 and 60, "Micrograms (ug)" should read -- Micrograms (μg) --.

Column 25,
Lines 4 and 43, "Micrograms (ug)" should read -- Micrograms (μg) --.
Line 30, "HFCF" should read -- HCFC --.

Column 26,
Line 11, "solvent" should read -- solvents --.
Lines 25 and 53, "Micrograms (ug)" should read -- Micrograms (μg) --.

Column 27,
Line 44, "thereof." should read -- thereof; --.

Signed and Sealed this

Twentieth Day of January, 2004

JON W. DUDAS
*Acting Director of the United States Patent and Trademark Office*